United States Patent
Aoyama et al.

(10) Patent No.: US 8,569,783 B2
(45) Date of Patent: Oct. 29, 2013

(54) LIGHT-EMITTING DEVICE

(75) Inventors: Tomoya Aoyama, Kanagawa (JP); Satoshi Seo, Kanagawa (JP); Satoko Shitagaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 71 days.

(21) Appl. No.: 13/371,412

(22) Filed: Feb. 11, 2012

(65) Prior Publication Data

US 2012/0205702 A1 Aug. 16, 2012

(30) Foreign Application Priority Data

Feb. 14, 2011 (JP) .................................. 2011-029185

(51) Int. Cl.
*H01L 33/60* (2010.01)

(52) U.S. Cl.
USPC .................... 257/98; 257/40; 257/E33.072

(58) Field of Classification Search
USPC ..................................... 257/98, 40, E33.072
See application file for complete search history.

(56) References Cited

U.S. PATENT DOCUMENTS

| | | | |
|---|---|---|---|
| 5,962,962 A | 10/1999 | Fujita et al. | |
| 6,535,338 B2 * | 3/2003 | Nishikawa | 359/619 |
| 6,768,260 B2 * | 7/2004 | Fukunaga et al. | 313/506 |
| 6,952,311 B2 * | 10/2005 | Sakai | 359/619 |
| 7,161,185 B2 * | 1/2007 | Yamazaki et al. | 257/88 |
| 7,199,520 B2 * | 4/2007 | Fujii et al. | 313/506 |
| 7,333,077 B2 * | 2/2008 | Koyama et al. | 345/76 |
| 7,375,893 B2 * | 5/2008 | Toyoda | 359/619 |
| 7,511,419 B2 * | 3/2009 | Takei et al. | 313/506 |
| 7,750,552 B2 * | 7/2010 | Yamazaki et al. | 313/503 |
| 7,859,627 B2 | 12/2010 | Nishida et al. | |
| 8,136,961 B2 * | 3/2012 | Miller et al. | 362/242 |
| 8,218,920 B2 * | 7/2012 | Van Ostrand et al. | 385/31 |
| 8,330,670 B2 * | 12/2012 | Yamazaki et al. | 345/1.2 |
| 2002/0145807 A1 * | 10/2002 | Nishikawa | 359/619 |
| 2003/0151359 A1 * | 8/2003 | Okada et al. | 313/506 |
| 2004/0007969 A1 | 1/2004 | Lu et al. | |

(Continued)

FOREIGN PATENT DOCUMENTS

| | | |
|---|---|---|
| JP | 2003-31353 | 1/2003 |
| JP | 2007-173424 | 7/2007 |

OTHER PUBLICATIONS

Reineke, S. et al, "White Organic Light-Emitting Diodes with Fluorescent Tube Efficiency," Nature, vol. 459, May 14, 2009, pp. 234-239.

*Primary Examiner* — Chuong A Luu
*Assistant Examiner* — Jaehwan Oh
(74) *Attorney, Agent, or Firm* — Husch Blackwell LLP

(57) ABSTRACT

An organic EL light-emitting device with excellent total luminous flux or with reduced emission unevenness and low power consumption is provided. Light from an organic EL layer in a region sandwiched between a light-transmitting conductive film of a lower electrode and a light-reflecting conductive film of an upper electrode is selectively emitted to the lower electrode side, and extracted outside by a first optical structure body. Light from the organic EL layer in a region sandwiched between a light-reflecting conductive film of the lower electrode and a light-transmitting conductive film of the upper electrode is selectively emitted to the upper electrode side, and extracted outside by a second optical structure body. The first optical structure body and the second optical structure body are formed on different planes and can overlap with each other; thus, light from the organic EL layer can be efficiently extracted outside.

19 Claims, 12 Drawing Sheets

(56) References Cited

U.S. PATENT DOCUMENTS

| | | | |
|---|---|---|---|
| 2004/0201545 A1* | 10/2004 | Yamazaki et al. | 345/1.1 |
| 2004/0227159 A1* | 11/2004 | Nakashima et al. | 257/202 |
| 2004/0227698 A1* | 11/2004 | Yamazaki et al. | 345/32 |
| 2004/0245531 A1* | 12/2004 | Fuii et al. | 257/88 |
| 2004/0263056 A1* | 12/2004 | Seo et al. | 313/500 |
| 2005/0024339 A1* | 2/2005 | Yamazaki et al. | 345/169 |
| 2005/0052348 A1* | 3/2005 | Yamazaki et al. | 345/44 |
| 2005/0258436 A1 | 11/2005 | Arai | |
| 2006/0017380 A1* | 1/2006 | Fukunaga et al. | 313/506 |
| 2006/0038488 A1* | 2/2006 | Fukunaga et al. | 313/506 |
| 2007/0120475 A1* | 5/2007 | Ishitani et al. | 313/506 |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2011/0134647 A1 | 6/2011 | Nishida et al. | |

* cited by examiner

LIGHT-EMITTING DEVICE

BACKGROUND OF THE INVENTION

1. Field of the Invention

The present invention relates to a light-emitting device including an element utilizing organic electroluminescence (EL) (hereinafter abbreviated to an organic EL element) between electrodes.

2. Description of the Related Art

In place of a light-emitting device such as an incandescent lamp or a fluorescent lamp which has been used for a long time, a light-emitting device including an organic EL element has been actively researched. The light-emitting device including an organic EL element has an advantage in that thickness and weight thereof can be easily reduced as compared to the thickness and weight of a conventional light-emitting device because a light-emitting material itself which is sandwiched between electrodes emits light (a so-called self-luminous element). Further, in order to utilize the advantage, the light-emitting device including an organic EL element can be attached to a curved surface.

In a conventional light-emitting device, most of the light emitted from a light-emitting material is not extracted outside but is absorbed and attenuated inside the light-emitting device because, before the light is extracted outside, light (also referred to as guided wave in the thin film mode) traveling in a plane direction while being totally reflected in the light-emitting material or an electrode and light (also referred to as guided wave in the substrate mode) traveling in the plane direction while being totally reflected in a substrate are generated.

Various methods by which the guided wave in the substrate mode and the guided wave in the thin film mode are extracted outside have been suggested, and a microlens method has been suggested as one of the methods.

The microlens method is a method by which, as disclosed in Patent Document 1, an optical structure body whose diameter is greater than that of a light-emitting portion of an organic EL element is provided so as to overlap with the organic EL element, so that the angle of light entering the optical structure body and an interface of an air layer is increased (that is, the light substantially enters perpendicularly), the guided wave in the substrate mode is less generated, and light from the organic EL element is further extracted outside, so that the amount of light emitted from the light-emitting device (also expressed as the total luminous flux of the light-emitting device) is increased.

REFERENCE

[Patent Document 1] Japanese Published Patent Application No. 2003-31353.

SUMMARY OF THE INVENTION

FIG. 10A is an example of a schematic top view of a light-emitting device in which an optical structure body is formed. As shown in FIG. 10A, in the light-emitting device in which an optical structure body 1520 is formed, a light-emitting region 1522 whose diameter is smaller than that of the optical structure body 1520 is formed so as to overlap with the optical structure body 1520. Note that the optical structure body 1520 is generally formed as dense as possible in order that the installation area thereof is increased; even in the case, for example, where the light-emitting region is formed in the dotted circle P in FIG. 10B, the optical structure body 1520 cannot be formed; and as shown in FIG. 10C (a schematic cross-sectional view taken along K-L in FIG. 10B), most of the light emitted from an organic EL layer 1504 is totally reflected by the optical structure body 1520. Accordingly, the amount of light that can be extracted outside is reduced. Note that a reference numeral 1501 indicates a first substrate, a reference numeral 1502 indicates a second substrate, a reference numeral 1601 indicates a first electrode, and a reference numeral 1602 indicates a second electrode in FIG. 10C. The optical structure body 1520 is formed on a surface of the first substrate 1501 which is, opposite to a surface over which the organic EL layer 1504 is formed.

The present invention is made in view of such a technical background. Accordingly, one object of the present invention is to provide a light-emitting device with excellent total luminous flux.

Another object of the present invention is to provide a light-emitting device with reduced emission unevenness and lower power consumption.

In the present invention provided for solving the above problem, structures of a first electrode and a second electrode which sandwich an organic EL layer and a setting position of an optical structure body provided on a substrate are devised. The details of the device are described with reference to FIGS. 11A and 11B. FIG. 11A illustrates structures of a first light-transmitting conductive film and a second light-transmitting conductive film, and FIG. 11B illustrates a setting condition of an optical structure body provided on a substrate. Note that FIGS. 11A and 11B are schematic views for illustrating a solution of the problem of the present invention, and do not strictly show the structures.

A first electrode 1610 includes, as shown in FIG. 11A, a conductive film with a high light-transmitting property (hereinafter, referred to as a first light-transmitting conductive film 1611) and a conductive film with a high light-reflecting property (hereinafter, referred to as a first light-reflecting conductive film 1612). A second electrode 1620 includes, as shown in FIG. 11A, a conductive film with a high light-transmitting property (hereinafter, referred to as a second light-transmitting conductive film 1621) and a conductive film with a high light-reflecting property (hereinafter, referred to as a second light-reflecting conductive film 1622). Further, the first light-transmitting conductive film 1611 overlaps with the second light-reflecting conductive film 1622, and the first light-reflecting conductive film 1612 overlaps with the second light-transmitting conductive film 1621. Accordingly, as shown in FIG. 11A, at a portion in which the first light-transmitting conductive film 1611 overlaps with the second light-reflecting conductive film 1622, light from the organic EL layer 1504 is reflected by the second light-reflecting conductive film 1622, and the reflected light is emitted selectively to the first substrate 1501 side. Further, at a portion in which the first light-reflecting conductive film 1612 overlaps with the second light-transmitting conductive film 1621, light from the organic EL layer 1504 is reflected by the first light-reflecting conductive film 1612, and the reflected light is emitted selectively to the second substrate 1502 side.

As a specific setting condition of the optical structure bodies provided on the substrate, as shown in FIG. 11B, a first optical structure body 1631 is formed on the surface of the first substrate 1501 which is opposite to the surface over which the organic EL layer 1504 is formed, and a second optical structure body 1632 is formed over the surface of the second substrate 1502 which is opposite to the surface facing the first substrate 1501.

The first optical structure body 1631 is provided so that the first optical structure body 1631 overlaps with the second light-reflecting conductive film 1622 and the periphery of the second light-reflecting conductive film 1622 is on the inner side than the periphery of the first optical structure body 1631. Further, the second optical structure body 1632 is provided so that the second optical structure body 1632 overlaps with the first light-reflecting conductive film 1612 and the periphery of the first light-reflecting conductive film 1612 is on the inner side than the periphery of the second optical structure body 1632. Accordingly, light from the organic EL layer with a larger area can be extracted outside efficiently.

Further, the first light-reflecting conductive films 1612 are electrically connected to each other so as to serve as an auxiliary wiring of the first electrode 1610; thus, the resistance of the first electrode 1610 is reduced. Similarly, the second light-reflecting conductive films 1622 are electrically connected to each other, so that the resistance of the second electrode 1620 is reduced. Accordingly, a light-emitting device with reduced emission unevenness and lower power consumption can be provided.

One embodiment of the present invention is a light-emitting device includes a first substrate and a second substrate. One surface of the first substrate is provided with a structure in which an organic EL layer containing an organic compound with a light-emitting property is provided between a first electrode and a second electrode. The other surface of the first substrate is provided with a first optical structure body. One surface of the second substrate faces the one surface of the first substrate. The other surface of the second substrate is provided with a second optical structure body. The first electrode is located between the first substrate and the second electrode, and includes a first light-transmitting conductive film and a first light-reflecting conductive film. The second electrode includes a second light-transmitting conductive film and a second light-reflecting conductive film. The organic EL layer includes a first light-emitting region in contact with and between the first light-transmitting conductive film and the second light-reflecting conductive film and a second light-emitting region in contact with and between the first light-reflecting conductive film and the second light-transmitting conductive film. The first optical structure body overlaps with the first light-emitting region, and the periphery of the first light-emitting region is on the inner side than the periphery of the first optical structure body. The second optical structure body overlaps with the second light-emitting region, and the periphery of the second light-emitting region is on the inner side than the periphery of the second optical structure body.

According to the above embodiment of the present invention, light from the organic EL layer is emitted selectively to the first substrate side in the first light-emitting region sandwiched between the first light-transmitting conductive film and the second light-reflecting conductive film because of the effect of the second light-reflecting conductive film. Further, light from the organic EL layer is emitted selectively to the second substrate side in the second light-emitting region sandwiched between the first light-reflecting conductive film and the second light-transmitting conductive film because of the effect of the first light-reflecting conductive film. The light emitted to the first substrate side is extracted outside with the use of the first optical structure body, and the light emitted to the second substrate side is extracted outside with the use of the second optical structure body. The first optical structure body and the second optical structure body are provided on different surfaces, and can be provided so as to overlap with each other. Accordingly, a light-emitting device with excellent total luminous flux can be provided.

In the above embodiment of the present invention, the second light-emitting region is positioned in a region which does not overlap with the first light-emitting region, so that the loss of light (light from the organic EL layer) caused by sandwiching the both sides of the organic EL layer between the light-reflecting conductive films can be avoided.

Further, in the above embodiment of the present invention, the first light-transmitting conductive film and the second light-transmitting conductive film each transmit 70% or more of light with a wavelength of longer than or equal to 400 nm and shorter than or equal to 700 nm, and the first light-reflecting conductive film and the second light-reflecting conductive film each reflect 50% or more of light with a wavelength of longer than or equal to 400 nm and shorter than or equal to 700 nm; so that the loss of light (light from the organic EL layer) in the light-transmitting conductive films and the light-reflecting conductive films can be reduced.

In the above embodiment of the present invention, the first light-reflecting conductive films are formed linearly and electrically connected to each other so as to serve as an auxiliary wiring of the first electrode, so that the resistance of the first electrode can be reduced. Similarly, the second light-reflecting conductive films are formed linearly and electrically connected to each other, so that the resistance of the second electrode can be reduced. Accordingly, emission unevenness of the light-emitting device can be reduced. Further, power consumption can be reduced. Note that it is necessary that at least one of the first reflecting conductive films or the second reflecting conductive films be formed linearly.

Further, in the above embodiment of the present invention, the diameter of the first optical structure body is set greater than or equal to 1.1 times and smaller than or equal to 3 times the diameter of the first light-emitting region which overlaps with the first optical structure body, and the diameter of the second optical structure body is set greater than or equal to 1.1 times and smaller than or equal to 3 times the diameter of the second light-emitting region which overlaps with the second optical structure body. Accordingly, total reflection of light from the light-emitting regions generated at the Interface between the optical structure bodies and an air layer can be reduced efficiently.

When the expression "B is formed over A" or "B is formed on A" is explicitly used in this specification and the like, the expression is not limited to the fact that B is formed in direct contact with A. The expression includes the case where A and B are not in direct contact with each other, that is, the case where another object is interposed between A and B. In this case, each of A and B is an object (e.g., a device, an element, a circuit, a wiring, an electrode, a terminal, a film, or a layer).

Accordingly, for example, when the expression that "a layer B is formed on or over a layer A" is explicitly used, the expression includes the case where the layer B is formed in direct contact with the layer A and the case where another layer (e.g., a layer C or a layer D) is formed in direct contact with the layer A and the layer B is formed in direct contact with the other layer. Note that another layer (e.g., a layer C or a layer D) may be a single layer or a stack layer.

Note that in this specification and the like, an ordinal number such as "first" or "second" is given for convenience to distinguish elements, and is not given to limit the number, arrangement, and the order of steps.

In one embodiment of the present invention, a light-emitting device with high emission efficiency can be provided.

In another embodiment of the present invention, a light-emitting device with reduced emission unevenness and lower power consumption can be provided.

DETAILED DESCRIPTION OF THE INVENTION

Figure 1A:
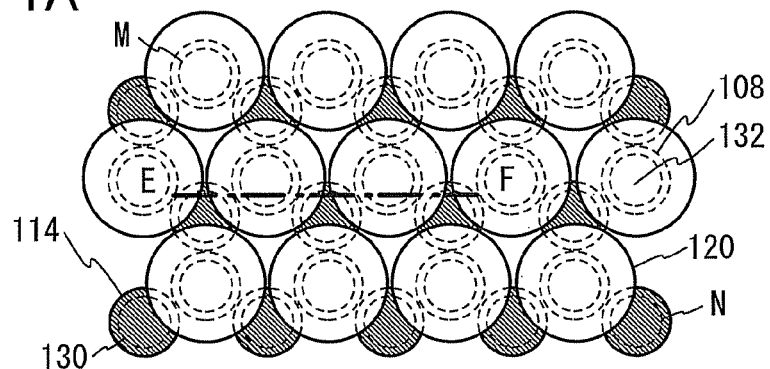
FIGS. 1A to 1C illustrate the structure of a light-emitting device according to Embodiment 1.

The details of embodiments are described with reference to the drawings. Note that the invention is not limited to the following description, and it is easily understood by those skilled in the art that various changes and modifications can be made without departing from the spirit and scope of the invention. Accordingly, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a method for manufacturing a light-emitting device according to one embodiment of the disclosed invention is described with reference to FIGS. 1A to 1C, FIG. 2, FIGS. 3A to 3E, and FIGS. 4A to 4C.

<Structure of Light-Emitting Device in this Embodiment>

Figure 1B:
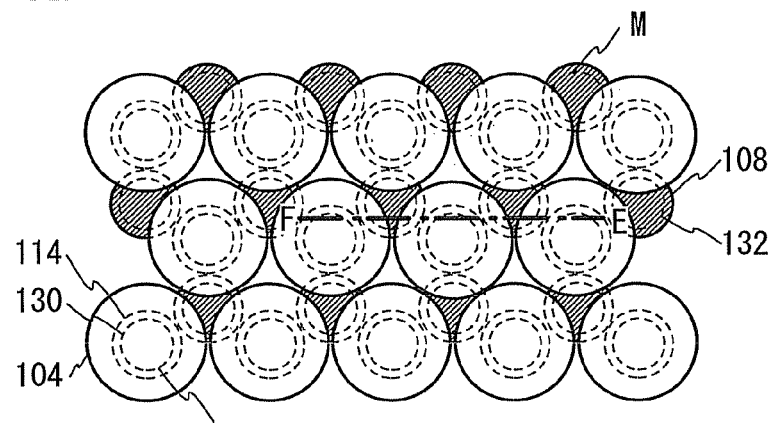
Figure 1C:
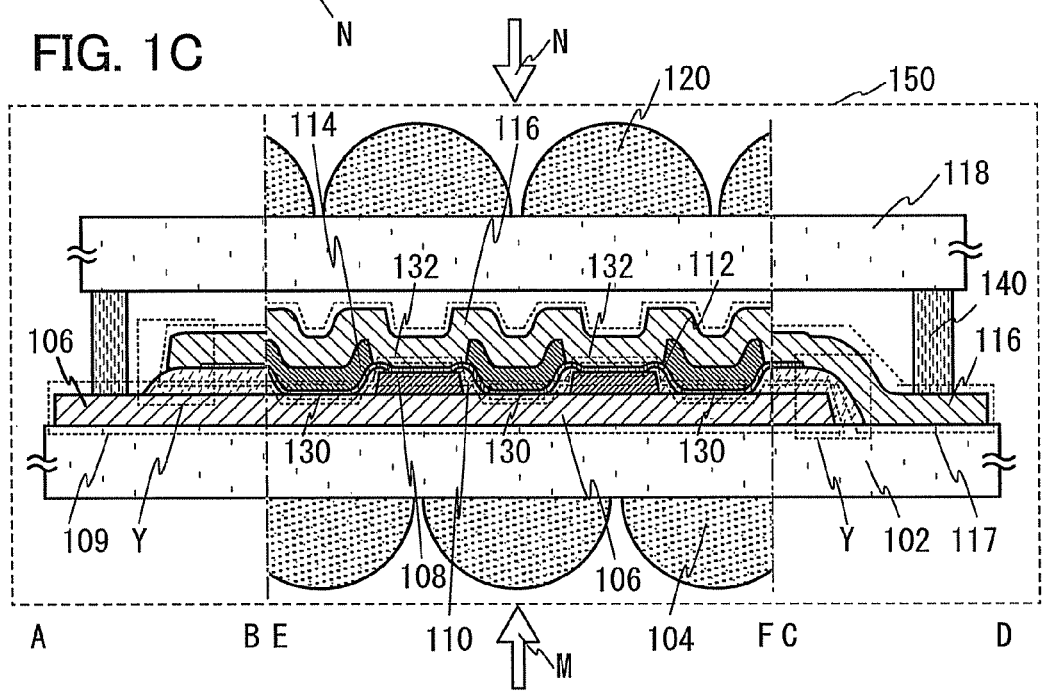
Figure 2:
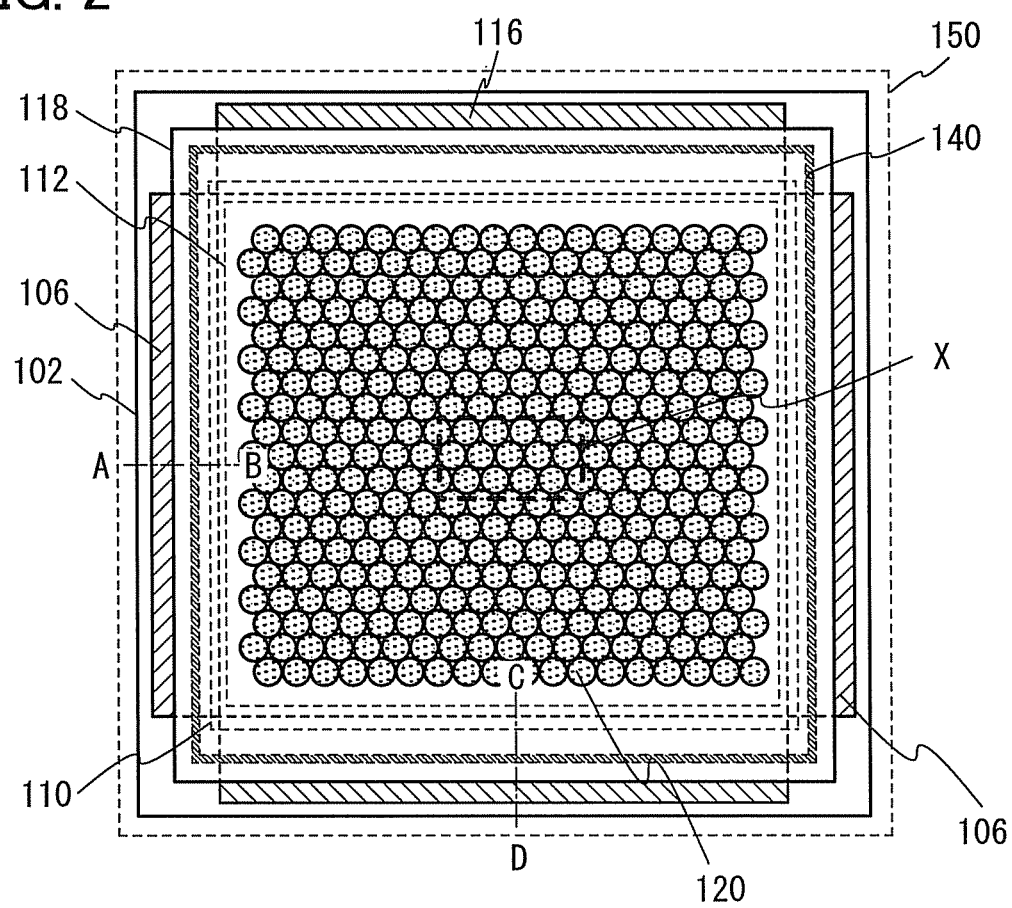
FIG. 2 illustrates the structure of a light-emitting device according to Embodiment 1.

FIG. 2 is a schematic top view of a whole light-emitting device 150 in this embodiment. Note that in FIG. 2, some components are not shown for the sake of clarity. FIGS. 1A to 1C are enlarged views illustrating a structure of a section X squarely surrounded by a dotted line in FIG. 2. FIG. 1A is a schematic plan view of part of the light-emitting device 150 which is seen from the second optical structure body 120 side (the white arrow N side in FIG. 1C), and FIG. 1B is a schematic plan view of part of the light-emitting device 150 which is seen from a first optical structure body 104 side (the white arrow M side in FIG. 1C). Further, FIG. 1C is a schematic cross-sectional view corresponding to a dashed-dotted line A-B and a dashed-dotted line C-D in FIG. 2, and a dotted line E-F in FIGS. 1A and 1B. Note that FIG. 1B illustrates the same section as that in FIG. 1A which is seen from the rear side (that is, the second optical structure body 120 side). A second light-emitting region 132 denoted by M in FIG. 1A is in the same position as the second light-emitting region 132 denoted by M in FIG. 1B. A first light-emitting region 130 denoted by N in FIG. 1A is in the same position as the first light-emitting region 130 denoted by N in FIG. 1B.

Note that in the schematic plan views in FIGS. 1A and 1B, some components (e.g., the first substrate 102) of the light-emitting device 150 are not shown for the sake of simplicity.

The light-emitting device 150 shown in FIG. 2 and FIGS. 1A to 1C includes a first substrate 102 and a second substrate 118. One surface of the first substrate 102 is provided with a structure in which an organic EL layer 112 containing an organic compound with a light-emitting property is provided between a first electrode 109 and a second electrode 117. The other surface of the first substrate 102 is provided with the first optical structure body 104. One surface of the second substrate 118 faces the one surface of the first substrate 102. The other surface of the second substrate 118 is provided with the second optical structure body 120. The first electrode 109 includes a first light-transmitting conductive film 106 and a first light-reflecting conductive film 108. The second electrode 117 includes a second light-transmitting conductive film 116 and a second light-reflecting conductive film 114. The organic EL layer 112 includes a first light-emitting region 130 sandwiched between a first light-transmitting conductive film 106 and a second light-reflecting conductive film 114 and the second light-emitting region 132 sandwiched between the first light-reflecting conductive film 108 and the second light-transmitting conductive film 116. Further the periphery of the first light-emitting conductive film 108 is covered with an insulator 110, and the first substrate 102 and the second substrate 118 are attached to each other with sealant 140 provided outside the region in which the organic EL layer 112 is formed (the end portion side of the substrate).

Here, the structures and positional relations of the first electrode 109, the second electrode 117, the first light-emitting region 130, and the second light-emitting region 132 are described with reference to FIGS. 12A and 12B for the sake of clarity.

Figure 12A:
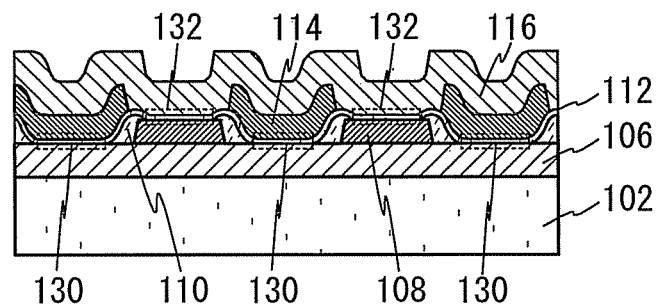
FIGS. 12A and 12B are supplementary views for illustrating a solution.

FIG. 12A illustrates the positions of the first light-emitting region 130 and the second light-emitting region 132, and only the first substrate 102, the first light-transmitting conductive film 106, the first light-reflecting conductive film 108, and the insulator 110, the organic EL layer 112, the second light-reflecting conductive film 114, and the second light-transmitting conductive film 116 in the cross section E-F of FIG. 1C are extracted. The organic EL layer 112 includes the first light-emitting region 130 which is in contact with and between the first light-transmitting conductive film 106 and the second light-reflecting conductive film 114. Further, the organic EL layer 112 also includes the second light-emitting region 132 which is in contact with and between the first light-reflecting conductive film 108 and the second light-transmitting conductive film 116.

Figure 12B:
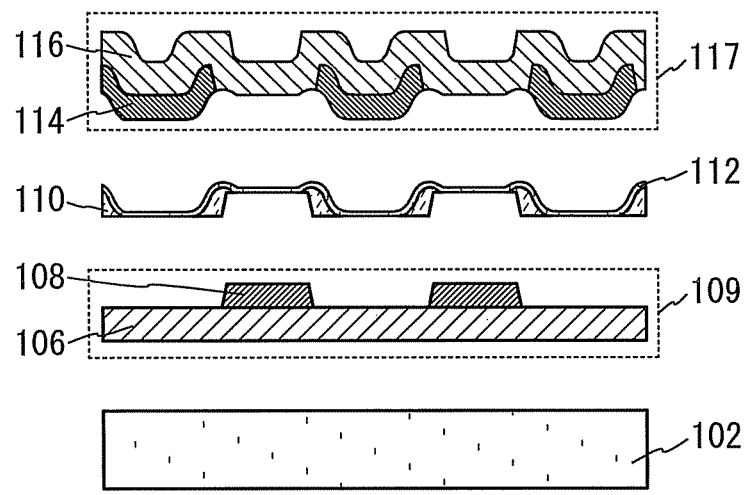

FIG. 12B illustrates the structures of the first electrode 109 and the second electrode 117. FIG. 12B is a view showing only the following components extracted from the cross section E-F in FIG. 1C: the first substrate 102, the first light-transmitting conductive film 106, the first light-reflecting conductive film 108, the insulator 110, the organic EL layer 112, the second light-reflecting conductive film 114, and the second light-transmitting conductive film 116 which are divided into components of the first electrode 109, components of the second electrode 117, and the other components. Further, the first electrode 109 includes the first light-transmitting conductive film 106 and the first light-reflecting conductive film 108, and the second electrode 117 includes the second light-reflecting conductive film 114 and the second light-transmitting conductive film 116.

The first light-transmitting conductive film 106 and the second light-transmitting conductive film 116 each transmit 70% or more of light with a wavelength of longer than or equal to 400 nm and shorter than or equal to 700 nm, and thus transmit most of the light from the organic EL layer 112. Further, the first light-reflecting conductive film 108 and the second light-reflecting conductive film 114 reflect 50% or more of light with a wavelength of longer than or equal to 400 nm and shorter than or equal to 700 nm, and thus reflect most of the light from the organic EL layer 112. Accordingly, in the first light-emitting region 130 which is sandwiched between the first light-transmitting conductive film 106 and the second light-reflecting conductive film 114, most of the light from the organic EL layer 112 travels to the first substrate 102 side and is extracted outside (to an air layer) through the first optical structure body 104. On the other hand, in the second light-emitting region 132 which is sandwiched between the first light-reflecting conductive film 108 and the second light-transmitting conductive film 116, most of the light from the organic EL layer 112 travels to the second substrate 118 side and is extracted outside (to an air layer) through the second optical structure body 120.

The first optical structure body 104 overlaps with the first light-emitting region 130 and the periphery of the first light-emitting region 130 is on the inner side than the periphery of the first optical structure body 104. Accordingly, light emitted from the first light-emitting region 130 can be extracted outside efficiently. Further, even in the case where the first optical structure body 104 is provided so as to overlap with the second optical structure body 120, there is no adverse effect on light extraction efficiency of the first optical structure body 104; thus, the degree of flexibility in setting the first optical structure body 104 is very high.

The second optical structure body 120 overlaps with the second light-emitting region 132, and the periphery of the second light-emitting region 132 is on the inner side than the periphery of the second optical structure body 120. Accordingly, light emitted from the second light-emitting region 132 can be extracted outside efficiently. Further, even in the case where the second optical structure body 120 is provided so as to overlap with the first optical structure body 104, there is no adverse effect on light extraction efficiency of the second optical structure body 120; thus, the degree of flexibility in setting the second optical structure body 120 is very high.

The first optical structure bodies 104 are provided at intervals in FIGS. 1A and 1C; however, the first optical structure bodies 104 may be provided in contact with each other. Note that the first optical structure bodies 104 are preferably provided so as not to overlap with each other. In this specification, all the first optical structure bodies 104 provided on the other surface of the first substrate 102 are defined and described as the first optical structure bodies 104 for clear explanation and convenience; however, not all the first optical structure bodies 104 are necessarily the same. The first optical structure bodies 104 may have different sizes or may have the same size.

Similarly, the second optical structure bodies 120 may have different sizes or may have the same size.

The first light-transmitting conductive film 106 is formed in a plane shape over one surface of the first substrate 102, so that part of the first light-transmitting conductive film 106 extends on the outer side than the sealant 140 (the end surface side of the substrate).

Although the first light-reflecting conductive film 108 is formed in a circular shape in this embodiment, the first light-reflecting conductive film 108 does not necessarily have a circular shape and may be formed in any shape. Note that in this embodiment, in order to suppress disconnection of the organic EL layer 112 due to a step portion of the first light-reflecting conductive film 108, the insulator 110 is formed in contact with the periphery of the first light-reflecting conductive film 108. However, the insulator 110 is not necessarily formed. In the case where the insulator 110 is not formed, the periphery of the first light-reflecting conductive film 108 is preferably tapered. Here, a taper angle is, for example, greater than or equal to 20° and less than or equal to 60°. Note that the taper angle means an inclination angle formed by the side surface and the bottom surface of a tapered layer (e.g., the first light-reflecting conductive film 108) when the layer is seen from the direction perpendicular to the cross-section (the surface which is perpendicular to the surface of the substrate) of the layer. The periphery of the first light-reflecting conductive film 108 is tapered, so that the disconnection of the organic EL layer 112 can be prevented even in the case where the insulator 110 is not formed.

Further, as in a section Y squarely surrounded by a dotted line in FIG. 1C, in the case where the second light-transmitting conductive film 116 is formed in the region which is outside the formation region of the organic EL layer 112 and over the first light-transmitting conductive film 106, it is necessary to form the insulator 110 in the region. Accordingly, a short circuit of the first light-transmitting conductive film 106 and the second light-transmitting conductive film 116 can be suppressed.

Structure examples of the organic EL layer 112 are described in detail in Embodiment 3.

The second light-reflecting conductive film 114 is faulted over the organic EL layer 112. Although the second light-reflecting conductive film 114 is formed in a circular shape in this embodiment, the second light-reflecting conductive film 114 does not necessarily have a circular shape and may be formed in any shape.

Part of the second light-transmitting conductive film 116 extends on the outer side than the sealant 140 (the end surface side of the substrate). The first light-transmitting conductive film 106 and the second light-transmitting conductive film 116 part of which extends on the outer side than the sealant 140 are connected to an external power source (not shown) and electrons or holes are supplied to the organic EL layer 112, so that the organic EL layer 112 can emit light.

The second substrate 118 is attached to the first substrate 102 with sealant 140 in a region which is on the end surface side of the second substrate 118 in which the organic EL layer 112 is not provided.

Then, the second optical structure body 120 overlaps with the second light-emitting region 132 and the periphery of the second light-emitting region 132 is on the inner side than the periphery of the second optical structure body 120. Further, at least part of the second optical structure body 120 overlaps with the first optical structure body 104.

<Manufacturing Method of Light-Emitting Device in this Embodiment>

A method for manufacturing the light-emitting device 150 is described below with reference to FIGS. 3A to 3E and FIGS. 4A to 4C.

Figure 3A:
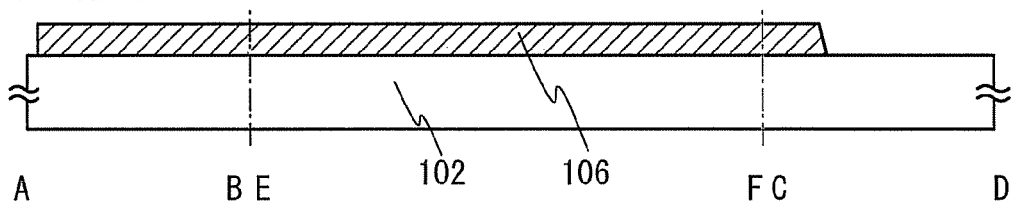
FIGS. 3A to 3E illustrate a method for manufacturing a light-emitting device according to Embodiment 1.

First, the first light-transmitting conductive film 106 is formed over one surface of the first substrate 102 (see FIG. 3A).

As the first substrate 102, any of the following can be used, for example: various glass substrates including soda-lime glass, clear flat glass, lead glass, tempered glass, and ceramic glass, non-alkali glass substrates including aluminosilicate glass, aluminoborosilicate glass, and barium borosilicate glass, and a quartz substrate.

The quartz substrate and various glass substrates described above have low water vapor and oxygen permeability; thus, degradation of the organic EL layer 112 to be provided in a later step can be suppressed.

The light-emitting device 150 in this embodiment emits light to the first substrate 102 side, so it is preferable that the first substrate 102 transmits 70% or more of light, preferably 90% or more of light, with respect to light of a visible light range (specifically, a wavelength range of longer than or equal to 400 nm and shorter than or equal to 700 nm).

As the first substrate 102, any of various plastic substrates including ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), and an ABS resin may alternatively be used.

When any of the above plastic substrates is used for the first substrate 102, the light-emitting device 150 can be reduced in thickness and weight; thus, the added value of the light-emitting device can be increased. Similarly, when any of the above plastic substrates is used for the second substrate 118, the light-emitting device 150 has flexibility; thus, a high-value-added light-emitting device which can be attached to a curved surface or the like can be provided.

Note that in the case where a plastic substrate is used for the first substrate 102, a protective film which is highly effective in blocking (has a property of blocking) water vapor and oxygen is preferably provided. As an example of the film which is highly effective in blocking water vapor and oxygen, a single layer or a stack layer of any of a silicon oxide film, a silicon nitride film, a silicon oxynitride film, a silicon nitride oxide film, an aluminum oxide film, and the like can be used. The protective film is provided, whereby the degradation of the organic EL layer 112 to be provided in a later step can be suppressed; thus, the reliability of the light-emitting device 150 can be increased.

As a material of the first light-transmitting conductive film 106, for example, a conductive metal oxide film such as indium oxide-tin oxide (indium tin oxide (ITO)), indium oxide-tin oxide containing silicon or silicon oxide, indium oxide-zinc oxide, or indium oxide containing tungsten oxide and zinc oxide can be used. These materials have high transmittance with respect to light of a visible light range and so can transmit light from the organic EL layer 112 at a high rate.

The light-emitting device in this embodiment emits light to the first substrate 102 side, so it is preferable that the first light-transmitting conductive film 106 transmits 70% or more of light, preferably 80% or more of light, with respect to light of a visible light range (specifically, a wavelength range of longer than or equal to 400 nm and shorter than or equal to 700 nm).

As a method for forming the first light-transmitting conductive film 106, a sputtering method, an ion plating method, a vacuum evaporation method, a cluster beam deposition method, a laser deposition method, or the like can be used. Alternatively the following method may be employed: a film is formed using a material in which any of the above-described materials reduced in size (specifically, smaller than 1 μm) is dispersed in a solvent (also referred to as nano-ink) by a coating method, a printing method, or the like, and then the solvent is removed. A method for removing the solvent is selected as appropriate depending on the material used; for example, heat treatment may be performed.

Note that a protective film may be provided over one surface of the first substrate 102 before the first light-transmitting conductive film 106 is provided. As the protective film, a single layer or a stack layer of any of a silicon oxide film, a silicon nitride film, a silicon oxynitride film, a silicon nitride oxide film, an aluminum oxide film and the like which transmit less water vapor and oxygen can be used. The protective film is provided, whereby the degradation of the organic EL layer 112 can be suppressed; thus, the reliability of the light-emitting device 150 can be increased.

Note that in this embodiment, the first substrate 102 and the second substrate 118 are attached to each other in a later step, and then the first optical structure body 104 is provided on a surface of the first substrate 102 which is opposite to the surface which faces the second substrate 118; however, the first substrate 102 may be provided in advance before the first light-transmitting conductive film 106 is formed. In that case, it is necessary to form the first light-reflecting conductive film 108, the insulator 110, and the second light-reflecting conductive film 114 so that the periphery of the first light-emitting region 130 is on the inner side than the periphery of the first optical structure body 104.

In the case where the first optical structure body 104 is provided on the first substrate 102 in advance before the first light-transmitting conductive film 106 is formed, instead of a method of forming the first optical structure body 104, a method to be described may be used by which a mold for forming a shape having a depression and a projection which is opposite to that of the optical structure body 104 is pressed against the surface of the first substrate 102 softened by heat treatment, which is opposite to the surface which faces the second substrate 118 (also referred to as a nanoimprint method or the like). In the case where the first optical structure body 104 is formed by the above method, cost for preparing the first optical structure body 104 in a step different from that of the first substrate 102 and cost and trouble for attaching the first optical structure body 104 to the other surface of the first substrate 102 can be omitted; thus, the manufacturing time and the manufacturing cost can be reduced.

Figure 3B:
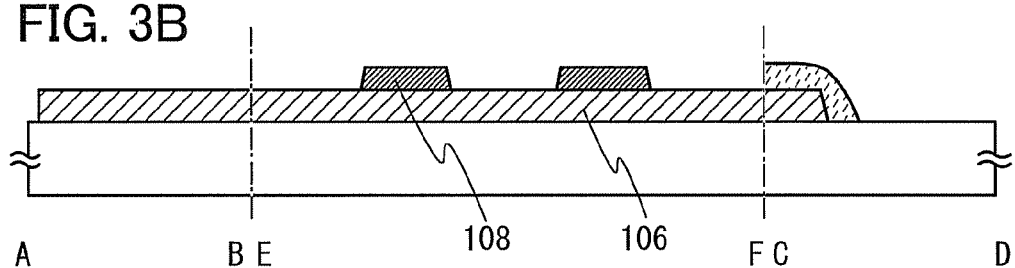

Next, the first light-reflecting conductive film 108 is framed over the first light-transmitting conductive film 106 (see FIG. 3B).

As a material of the first light-reflecting conductive film 108, for example, a single layer or a stack layer of any of metal materials such as aluminum, gold, platinum, silver, nickel, tungsten, chromium, molybdenum, cobalt, copper, magnesium, titanium, and palladium or an alloy containing any of these metal materials can be used.

The first light-reflecting conductive film 108 has a function of reflecting light from the second light-emitting region 132 (region sandwiched between the second light-transmitting conductive film 116 to be formed later and the first light-reflecting conductive film 108) formed in part of the organic EL layer 112 to be formed later to the second substrate 118 side. Accordingly, it is preferable that the first light-reflecting conductive film 108 reflects 50% or more of light, preferably 70% or more of light, more preferably 90% or more of light, with respect to light of a wavelength range of longer than or equal to 400 nm and shorter than or equal to 700 nm.

Further, the resistivity of the first light-reflecting conductive film 108 is preferably lower than that of the first light-transmitting conductive film 106. Specifically, the resistivity of the first light-reflecting conductive film 108 is preferably lower than or equal to $1 \times 10^{-4} \Omega \cdot m$, more preferably lower than or equal to $5 \times 10^{-5} \Omega \cdot m$, still more preferably lower than or equal to $5 \times 10^{-8} \Omega \cdot m$.

As described above, the first light-reflecting conductive film 108 having a resistivity much lower than that of the first light-transmitting conductive film 106 is formed in contact with the first light-transmitting conductive film 106, thus, the resistivity as a whole can be reduced. Accordingly, emission unevenness of the light-emitting device can be reduced. Further, the power consumption of the light-emitting device can be reduced.

The first light-reflecting conductive film 108 may be formed as follows: a film is formed using any of the above materials by a sputtering method, a resistance heating evaporation method, an electron beam evaporation method, an ion plating method, or the like, and then the film is etched by a known technique such as a dry etching method or a wet etching method. Alternatively, the first light-reflecting conductive film 108 can be formed while a metal mask or the like provided with an opening in which the first light-reflecting conductive film 108 is to be formed is provided over the first substrate 102. When such a method is employed, an etching step is not required; thus, time and cost needed to manufacture the light-emitting device 150 can be reduced.

Figure 3C:
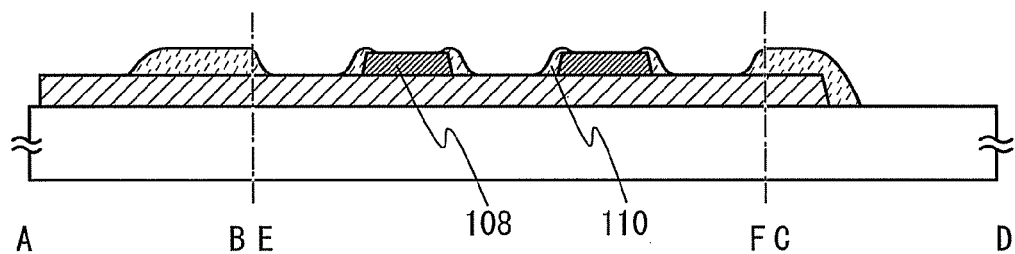

Next, the insulator 110 which covers the periphery of the first light-reflecting conductive film 108 is formed (see FIG. 3C).

As the insulator 110, for example, any of organic resins such as an acrylic resin, a polyimide resin, a polyamide resin, a polyamide imide resin, and an epoxy resin can be used. Note that it is preferable that the angle at which the insulator 110 is in contact with the first substrate 102 and the angle at which the insulator 110 is in contact with the first light-reflecting conductive film 108 be each less than or equal to 60°, preferably less than or equal to 40°. The angles are set to be smaller angles as described above so that the disconnection of the organic EL layer 112 which is to be formed over the insulator 110 in a later step can be suppressed.

The insulator 110 may be formed as follows: a film is formed using any of the above materials over the first substrate 102 and the first light-reflecting conductive film 108 by a spin coating method, a printing method, an inkjet method, or the like, cure treatment which is selected in accordance with its material is performed, and then the film is subjected to a known technique such as etching treatment. Note that in the case where any of the various plastic substrates is used for the first substrate 102, it is necessary to perform cure treatment within a range of the conditions that the first substrate 102 is not deformed.

Figure 3D:
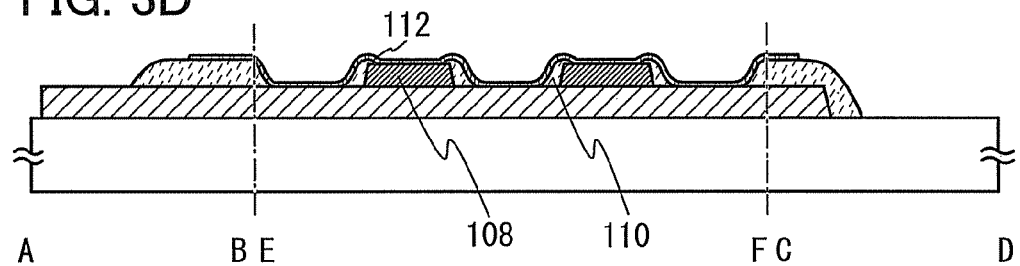

Next, the organic EL layer 112 is formed over the first light-reflecting conductive film 108 and the insulator 110 (see FIG. 3D).

The details of a material and a structure used for the organic EL layer 112 are described in Embodiment 3. A known material may be used instead of the material described in Embodiment 3. Further, the material may be selected as appropriate depending on the intended use. For example, in the case where the light-emitting device is used for an interior lighting device such as an incandescent lamp or a fluorescent lamp, the organic EL layer 112 may have a three-layer structure for emission of red (R) light, green (G) light, and blue (B) light, and the three layers are finely tuned in formation so that emission of white light such as daylight or neutral white light can be obtained. Alternatively, two layers which emit light of complementary colors may be stacked and finely tuned in formation. It is needless to say that the structure of the organic EL layer 112 is not limited thereto.

Note that parts of the organic EL layer 112 may be separately formed. For example, with the use of a metal mask, part of the organic EL layer 112 which is to be the first light-emitting region 130 and another part of the organic EL layer 112 which is to be the second light-emitting region 132 may be separately formed. In the separate formation, all the layers in the organic EL layer 112 may be separately formed, or one or more layers in the organic EL layer 112 may be selected and separately formed.

The separate formation enables manufacture of, for example, a light-emitting device or the like a surface of which emits light whose color differs from that of light emitted from the rear surface.

As a method for forming the organic EL layer 112, for example, a vacuum evaporation method such as a resistance heating evaporation method or an electron beam evaporation method can be employed. Note that the organic EL layer 112 is significantly degraded by water vapor, oxygen, or the like in the air, so it is preferably formed on the inner side than sealant (not shown) which is used to attach the first substrate 102 to the second substrate 118. In order to form the organic EL layer 112 in such an intended portion, for example, a metal mask or the like provided with an opening in which the organic EL layer 112 to be formed may be used.

A light-emitting device with the structure described in this embodiment can emit light from both the surface and the rear surface of the light-emitting device even in the case where the organic EL layer 112 is formed only once, which is effective in terms of reductions in manufacturing time and manufacturing cost.

Figure 3E:
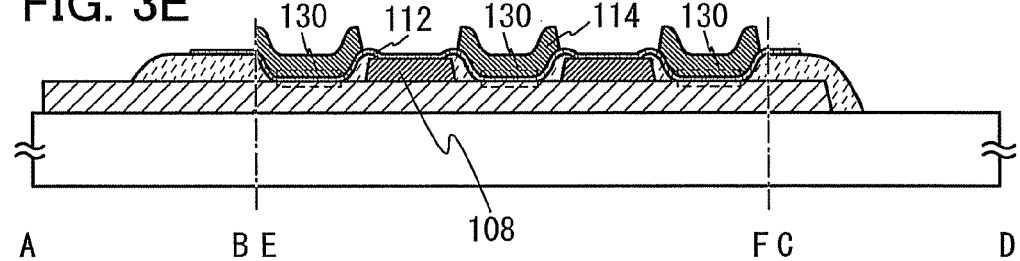

Next, the second light-reflecting conductive film 114 is formed over the organic EL layer 112 (see FIG. 3E).

A material similar to that of the first light-reflecting conductive film 108 can be used for the second light-reflecting conductive film 114. Further, reflectance and resistivity needed fore second light-reflecting conductive film 114 is equivalent to or substantially equivalent to those needed for the first light-reflecting conductive film 108.

The second light-reflecting conductive film 114 may be formed as follows: while a metal mask or the like provided with an opening in which the second light-reflecting conductive film 114 is to be formed is provided over the first substrate 102, any of the above materials is deposited by a sputtering method, a resistance heating evaporation method, an electron beam evaporation method, an ion plating method, or the like. Note that the deposition treatment is preferably performed at a temperature in the range where an organic material included in the organic EL layer 112 is not crystallized by heat. Further, in the case where the second light-reflecting conductive film 114 is formed by a sputtering method, a method by which the organic EL layer 112 is less damaged such as a facing target sputtering method (also referred to as a mirrortron sputtering method) is preferably used.

The second light-reflecting conductive film 114 is formed, so that part of the organic EL layer 112 becomes the first light-emitting region 130 sandwiched between the first light-transmitting conductive film 106 and the second light-reflecting conductive film 114 (see FIG. 3E).

Note that the second light-reflecting conductive film 114 is preferably formed so as not to include a region in which the organic EL layer 112 is in contact with and between the first light-reflecting conductive film 108 and the second light-reflecting conductive film 114. This is because in the region, light from the organic EL layer 112 is attenuated due to multipath reflection by the first light-reflecting conductive film 108 and the second light-reflecting conductive film 114.

Figure 4A:
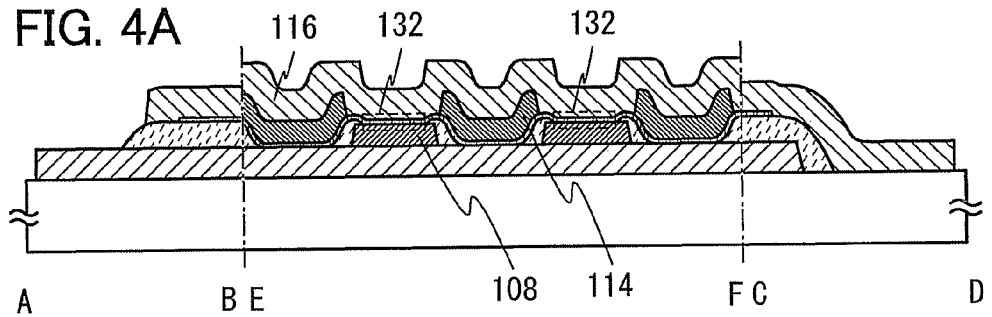
FIGS. 4A to 4C illustrate a method for manufacturing a light-emitting device according to Embodiment 1.

Next, the second light-transmitting conductive film 116 is formed over the organic EL layer 112 and the second light-reflecting conductive film 114 (see FIG. 4A).

A material similar to that of the first light-transmitting conductive film 106 can be used for the second light-transmitting conductive film 116. Further, light transmittance needed for the second light-transmitting conductive film 116 is similar to that for the first light-transmitting conductive film 106.

As a method for forming the second light-transmitting conductive film 116, a sputtering method, an ion plating method, a vacuum evaporation method, a cluster beam deposition method, a laser deposition method, or the like may be used. Note that the deposition treatment is preferably performed at a temperature in the range where an organic material included in the organic EL layer 112 is not crystallized by heat. Further, in the case where the second light-transmitting conductive film 116 is formed by a sputtering method, a method by which the organic EL layer 112 is less damaged such as a facing target sputtering method or the like is preferably used.

The second light-transmitting conductive film 116 is formed, so that part of the organic EL layer 112 becomes the second light-emitting region 132 which is sandwiched between the first light-reflecting conductive film 108 and the second light-transmitting conductive film 116.

Figure 4B:
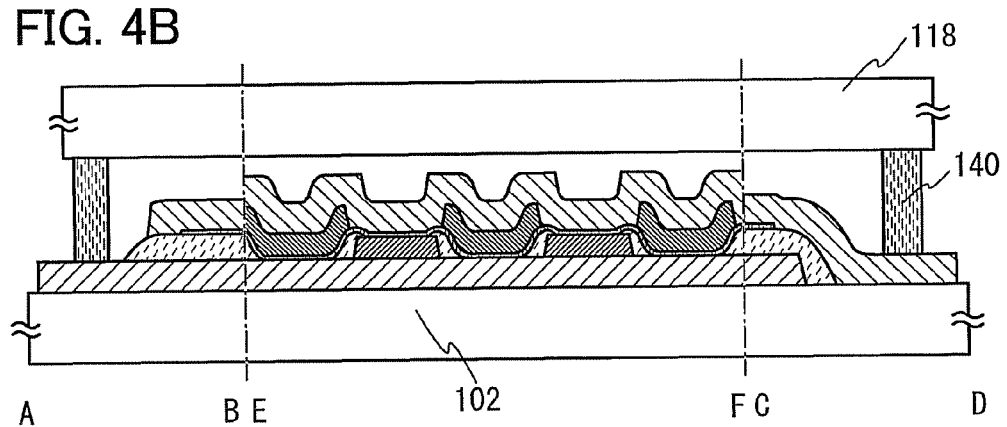

Next, the sealant 140 is provided over the second light-transmitting conductive film 116, and the first substrate 102 is attached to the second substrate 118 with the sealant 140 provided therebetween so that one surface of the first substrate 102 and one surface of the second substrate 118 face each other (see FIG. 4B).

A material similar to that of the first substrate 102 can be used for the second substrate 118. Further, light transmittance needed for the second substrate 118 and a method and a material for forming a protective film for the second substrate 118 are similar to those for the first substrate 102.

The second substrate 118 is attached to the first substrate 102 by sealant outside a portion in which the organic EL layer 112 is formed (on the end portion side of the substrate), and the organic EL layer 112 is sealed by the first substrate 102, the second substrate 118, and the sealant.

Note that sealing is preferably performed in a reduced pressure or in an inert gas atmosphere such as a nitrogen atmosphere. Accordingly, the space surrounded by the first substrate 102, the second substrate 118, and the sealant is in a reduced pressure or is filled with an inert gas, so that the degradation of the organic EL layer 112 can be suppressed.

Figure 4C:
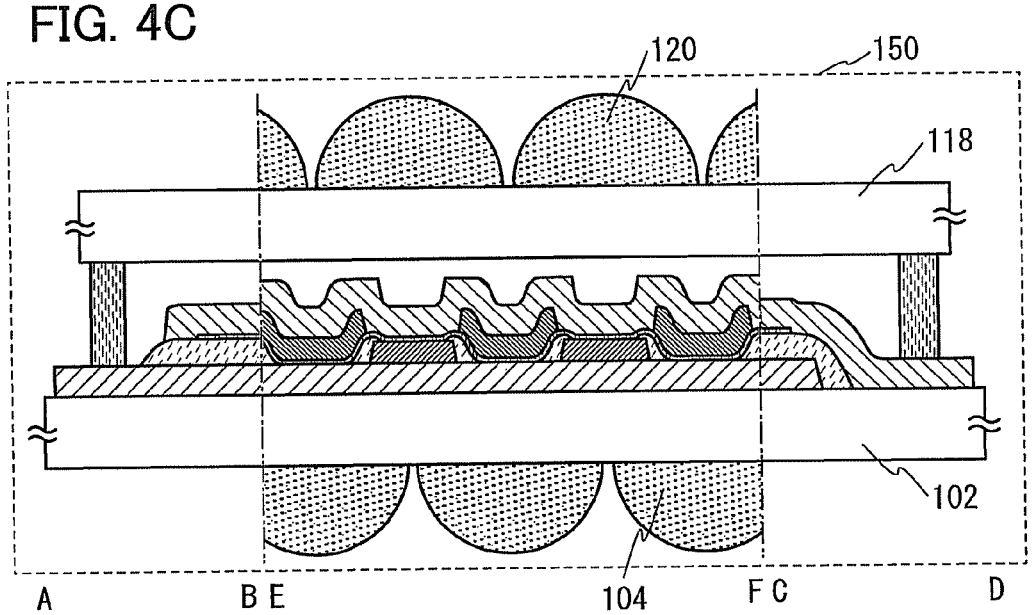

Next, the other surface of the first substrate 102 is provided with the first optical structure body 104, and the other surface of the second substrate 118 is provided with the second optical structure body 120 (see FIG. 4C).

The first optical structure body 104 and the second optical structure body 120 can be formed using, for example, a hemispherical lens, a micro lens array, a film provided with an uneven structure, a light diffusing film, or the like, and may be attached to the other surface of the first substrate 102 and the other surface of the second substrate 118, respectively, by a known adhesive or the like.

Alternatively, an uneven structure may be formed directly on the substrate. As a method for forming an uneven structure directly on the substrate, for example, an etching method, a sand blasting method, a microblast processing method, a droplet discharge method, a printing method (such as screen printing or offset printing by which a pattern is formed), a coating method such as a spin coating method, a dipping method, a dispenser method, a nanoimprint method, or the like can be employed as appropriate.

Alternatively, an uneven structure may be formed in such a manner that an organic resin whose surface includes a hemispherical lens, a micro lens array, a film provided with an uneven structure, a light diffusing film, or the like is bonded to the other surface of the first substrate 102 and the other surface of the second substrate 118 with a known adhesive or the like.

It is preferable that the diameter of the first optical structure body 104 is set greater than or equal to 1.1 times and smaller than or equal to 3 times, preferably greater than or equal to 1.5 times and smaller than or equal to 3 times, the diameter of the second light-reflecting conductive film 114 which overlaps with the first optical structure body 104. Further, it is more preferable that the diameter of the first optical structure body 104 be set greater than or equal to 1.1 times and smaller than or equal to 3 times, preferably greater than or equal to 1.5 times and smaller than or equal to 3 times, the diameter of the first light-emitting region 130 which overlaps with the first optical structure body 104.

It is preferable that the diameter of the second optical structure body 120 is set greater than or equal to 1.1 times and smaller than or equal to 3 times, preferably greater than or equal to 1.5 times and smaller than or equal to 3 times, the diameter of the first light-reflecting conductive film 108 which overlaps with the second optical structure body 120. Further, it is more preferable that the diameter of the second optical structure body 120 be set greater than or equal to 1.1 times and smaller than or equal to 3 times, preferably greater than or equal to 1.5 times and smaller than or equal to 3 times, the diameter of the second light-emitting region 132 which overlaps with the second optical structure body 120.

With the above-described structure, light from the organic EL layer 112 can be more efficiently extracted outside with the first optical structure body 104 and the second optical structure body 120.

Note that it is preferable that a center portion of the first optical structure body 104 overlaps with the first light-emitting region 130 and at least part of the first optical structure body 104 overlap with the second optical structure body 120. Further, it is preferable that a center portion of the second optical structure body 120 overlaps with the second light-emitting region 132 and at least part of the second optical structure body 120 overlap with the first optical structure body 104.

The first optical structure body 104 and the second optical structure body 120 are provided so as to partly overlap with each other, so that optical structure bodies can be provided in a larger area compared to optical structure bodies in the case of a normal microlens method by which light is extracted from one surface of a substrate.

<Effects of Light-Emitting Device in this Embodiment>

The light-emitting device 150 manufactured through the above process, light from the first light-emitting region 130 is selectively emitted toward the first substrate 102 because of the effect of the second light-reflecting conductive film 114 and extracted outside by the first optical structure body 104. Further, light from the second light-emitting region 132 is selectively emitted toward the second substrate 118 because of the effect of the first light-reflecting conductive film 108 and extracted outside by the second optical structure body 120.

Note that the first optical structure body 104 and the second optical structure body 120 at least partly overlap with each other, so that optical structure bodies can be provided in a larger area compared to optical structure bodies of a light-emitting device which has the same size as the light-emitting device 150 and which is provided with the optical structure bodies on only one surface of a substrate.

Owing to the above effects, the total luminous flux of the light-emitting device 150 with the structure described in this embodiment is excellent.

Embodiment 2

In this embodiment, a structure with different shapes of the first light-reflecting conductive film 108 and the second light-reflecting conductive film 114 in the light-emitting device manufactured in Embodiment 1 is described with reference to FIGS. 5A to 5C and FIGS. 6A to 6C. Note that even in the case where the shapes of the first light-reflecting conductive film 108 and the second light-reflecting conductive film 114 are different, the different points of a schematic top view of the whole device are not shown; thus, FIG. 2 is used for illustrating the schematic top view of the whole device. Further, in the structure of this embodiment described below, the same portions or portions having similar functions are denoted by the same reference numerals in different drawings, in Embodiment 1, and the description thereof is not repeated.

<Structure of Light-Emitting Device in this Embodiment>

Figure 5A:
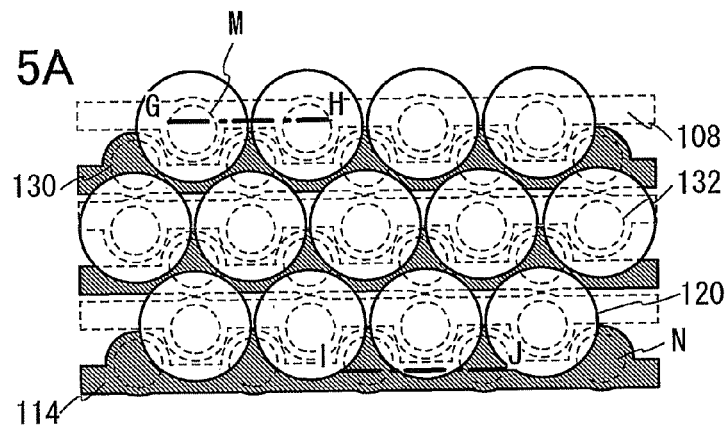
FIGS. 5A to 5C illustrate the structure of a light-emitting device according to Embodiment 2.
Figure 5B:
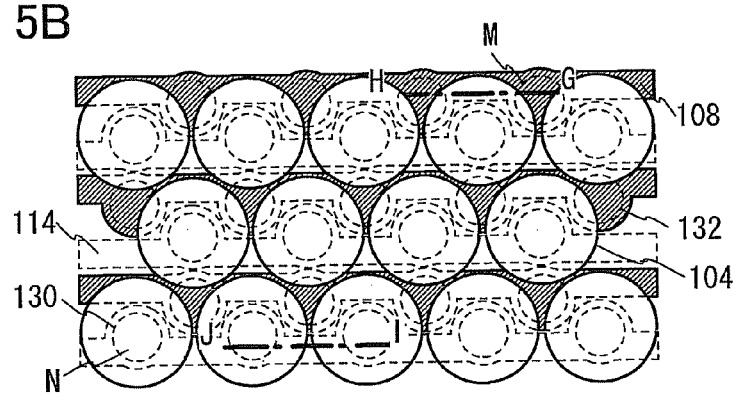
Figure 5C:
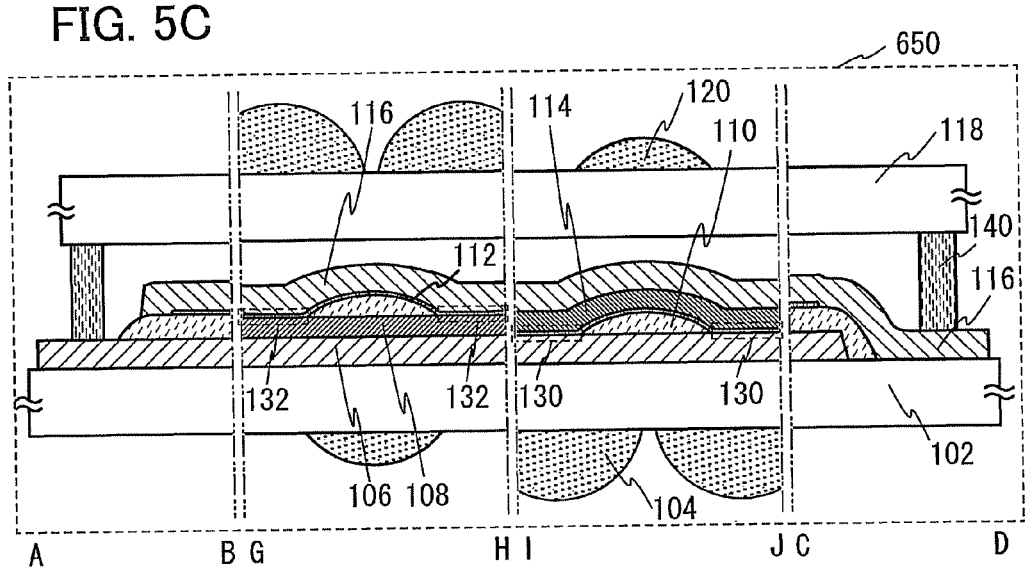

FIGS. 5A and 5B each illustrate the section X squarely surrounded by a dotted line in FIG. 2. FIG. 5A is a schematic plan view of part of a light-emitting device 650 which is seen from the second optical structure body 120 side, and FIG. 5B is a schematic plan view of part of the light-emitting device 650 which is seen from the first optical structure body 104 side. Further, FIG. 5C is a schematic cross-sectional view corresponding to a dashed-dotted line A-B and a dotted line C-D in FIG. 2, and a dashed-dotted line G-H and a dotted line I-J in FIGS. 5A and 5B. Note that FIG. 5B illustrates the same section as that in FIG. 5A which is seen from the rear side (that is, the first optical structure body 104 side). The first light-emitting region 130 denoted by M in FIG. 5A is in the same position as the second light-emitting region 132 denoted by M in FIG. 5B. The second light-emitting region 132 denoted by N in FIG. 5A is in the same position as the first light-emitting region 130 denoted by N in FIG. 5B.

Note that the first light-reflecting conductive film 108 and the second light-reflecting conductive film 114 which are components of the light-emitting device 650 are described below; however, other components are basically the same as those in Embodiment 1 and are not described.

The first light-reflecting conductive film 108 is formed so as to overlap with a plurality of second light-emitting regions 132 in this embodiment. That is, the plurality of second light-emitting regions 132 is formed and connected to each other as shown in FIGS. 5A and 5B. With such a structure, the resistance of the first electrode 109 can be markedly reduced.

Note that although the insulator 110 is formed in this embodiment, the periphery of the first light-reflecting conductive film 108 is preferably tapered in the case where the insulator 110 is not formed. Here, a taper angle is, for example, greater than or equal to 20° and less than or equal to 60°. Note that the taper angle means an inclination angle formed by a side surface and a bottom surface of a tapered layer (e.g., the first light-reflecting conductive film 108) when the layer is observed in a direction perpendicular to a cross section (a plane which is perpendicular to the surface of the substrate) of the layer. The periphery of the first light-reflecting conductive film 108 is tapered, so that disconnection can be prevented during formation of the organic EL layer 112.

The second light-reflecting conductive film 114 is formed so as to overlap with the plurality of first light-emitting regions 130 in this embodiment. That is, the second light-reflecting conductive film 114 is formed so that the plurality of first light-emitting regions 130 is formed and connected to each other as shown in FIGS. 5A and 5B. With such a structure, the resistance of the second electrode 117 can be markedly reduced.

<Manufacturing Method of Light-Emitting Device in this Embodiment>

A method for manufacturing the light-emitting device 650 is described below with reference to FIGS. 6A to 6C.

Figure 6A:
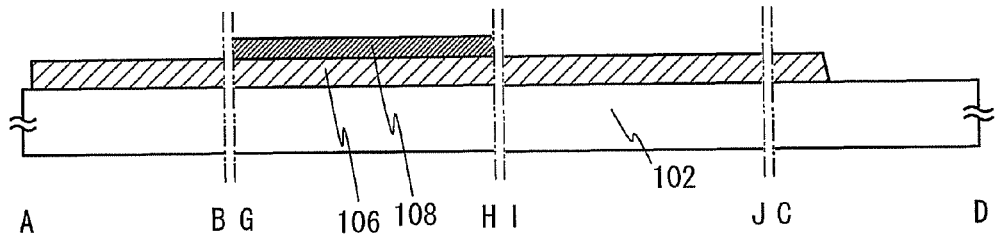
FIGS. 6A to 6C illustrate a method for manufacturing a light-emitting device according to Embodiment 2.

First, the first light-transmitting conductive film 106 is formed over the first substrate 102, and the first light-reflecting conductive film 108 is formed over the first light-transmitting conductive film 106 (see FIG. 6A). A material and a method for forming components are similar to those in Embodiment 1; thus, description thereof is omitted here.

The entire first light-reflecting conductive film 108 may be formed with one material or part of the first light-reflecting conductive film 108 may be formed with a different material. For example, there is a method by which a material having high reflectance with respect to light with a wavelength of longer than or equal to 400 nm and shorter than or equal to 700 nm is used for a portion which overlaps with the second light-emitting region 132 and a material having low reflectance is used in other portions. With the use of the method, light from the second light-emitting region 132 can be efficiently emitted to the second optical structure body 120 side. Further, the resistance of the first electrode 109 can be reduced, so that emission unevenness in a plane can be reduced.

Figure 6B:
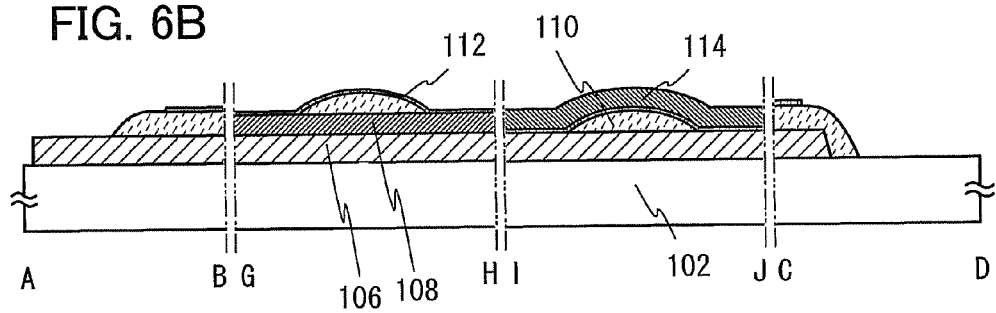
Figure 6C:
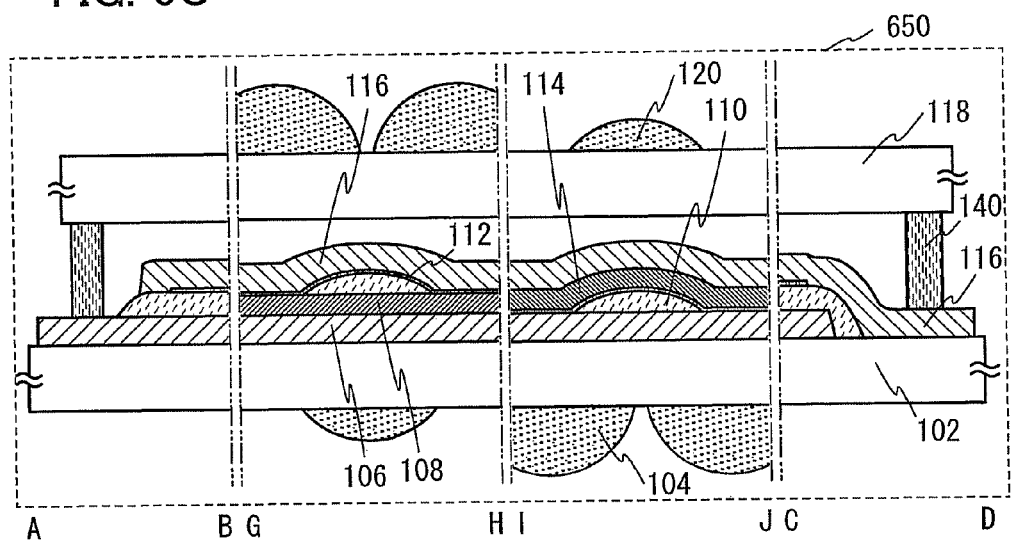

Next, the insulator 110 is formed over the first light-transmitting conductive film 106 and the first light-reflecting conductive film 108, the organic EL layer 112 is formed over the first light-reflecting conductive film 108 and the insulator 110, and the second light-reflecting conductive film 114 is formed over the organic EL layer 112 (see FIG. 6B).

The entire second light-reflecting conductive film 114 may be formed with one material or part of the second light-reflecting conductive film 114 may be formed with a different material. For example, there is a method by which a material having high reflectance with respect to light with a wavelength of longer than or equal to 400 nm and shorter than or equal to 700 nm is used for a portion which overlaps with the first light-emitting region 130 and a material having low reflectance is used in other portions. With the use of the method, light from the first light-emitting region 130 can be efficiently emitted to the first optical structure body 104 side and the resistance of the second electrode 117 can be reduced; therefore, emission unevenness in a plane can be reduced.

The description of the following steps is omitted here because it is similar to that in Embodiment 1.

<Effects of Light-Emitting Device in this Embodiment>

The light-emitting device 650 manufactured by the above process has, in addition to the effects described in Embodiment 1, an effect that the resistance of the first electrode 109 is markedly reduced because the first light-reflecting conductive film 108 is led linearly. Further, the resistance of the second electrode 117 can be markedly reduced because the second light-reflecting conductive film 114 is led linearly.

Owing to the above effects, the emission unevenness of the light-emitting device 650 with the structure described in this embodiment is reduced.

Embodiment 3

In this embodiment, examples of an EL layer which can be applied to one embodiment of the present invention are described with reference to FIGS. 7A to 7C.

Figure 7A:
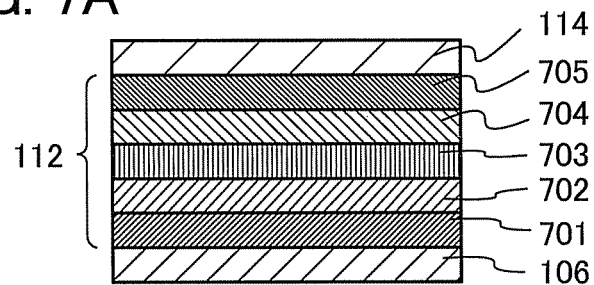
FIGS. 7A to 7C illustrate organic EL layers.

FIG. 7A is a schematic cross-sectional view of the organic EL layer 112 in the first light-emitting region 130 which is sandwiched between the first light-transmitting conductive film 106 and the second light-reflecting conductive film 114. A material and a structure similar to those of the above embodiment can be used for the first light-transmitting conductive film 106 and the second light-reflecting conductive film 114.

The organic EL layer 112 should include at least a light-emitting layer containing an organic compound with a light-emitting property. In addition, the organic EL layer 112 can be formed with a stacked-layer structure in which a layer containing a substance with a high electron-transport property, a layer containing a substance with a high hole-transport property, a layer containing a substance with a high electron-injection property, a layer containing a substance with a high hole-injection property, a layer containing a bipolar substance (substance with a high electron-transport property and a high hole-transport property), and the like are combined as appropriate. In this embodiment, the organic EL layer 112 includes a hole-injection layer 701, a hole-transport layer 702, a layer 703 containing an organic compound with a light-emitting property, an electron-transport layer 704, an electron-injection buffer layer 706, an electron-relay layer 707, and a composite material layer 708 which is in contact with the second light-reflecting conductive film 114 which are stacked in that order from the first light-transmitting conductive film 106 side. Note that an inversion stacked structure thereof may be used.

A method for forming the light-emitting element illustrated in FIG. 7A is described.

The hole-injection layer 701 is a layer containing a substance with a high hole-injection property. Examples of substances with a high hole-injection property are metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of the substances are phthalocyanine-based compounds such as phthalocyanine (abbreviation: $H_2Pc$) and copper(II) phthalocyanine (abbreviation: CuPc).

Other examples of the substances are aromatic amine compounds which are low molecular organic compounds such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples of the substances are high molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), and polyaniline/poly(styrenesulfonic acid) (PAni/PSS).

In particular, as the hole-injection layer 701, a composite material in which an acceptor substance is mixed with an organic compound with a high hole-transport property is preferably used. With the use of the composite material in which an acceptor substance is added to a substance with a high hole-transport property, excellent hole injection from a first conductive layer 750 can be obtained, which leads to a reduction in the drive voltage of the light-emitting element. Such a composite material can be formed by co-depositing a substance with a high hole-transport property and an acceptor substance. The hole-injection layer 701 is formed using the composite material, whereby hole injection from the first conductive layer 750 to the organic EL layer 112 is facilitated.

As the organic compound used for the composite material, any of a variety of compounds such as aromatic amine compounds, carbazole derivatives, aromatic hydrocarbons, and high molecular compounds (e.g., oligomers, dendrimers, and polymers). Note that the organic compound used for the composite material is preferably an organic compound with a high hole-transport property. Specifically, a substance having a hole mobility of $10^{-6}$ cm$^2$/Vs or more is preferably used. Note that other substances may also be used as long as a hole-transport property thereof is higher than an electron-transport property thereof. The organic compounds which can be used for the composite material are specifically described below.

Examples of the organic compound that can be used for the composite material are aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic, compound that can be used are aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds such as 7,7,8,8-tetracyano-2,3,5,6-tetrafluoro-quinodimethane (abbreviation: $F_4$-TCNQ) and chloranil, transition metal oxides, and oxides of metals that belong to Groups 4 to 8 in the periodic table. Specific preferred examples include vanadium oxide, niobium oxide, tantalum oxide, chromium oxide, molybdenum oxide, tungsten oxide, manganese oxide, and rhenium oxide because their electron-acceptor properties are high. Among these, molybdenum oxide is especially preferable since it is stable in the air and its hygroscopic property is low and is easily treated.

The composite material may be formed using the above-described electron acceptor and the above-described high molecular compound such as PVK, PVTPA, PTPDMA, or Poly-TPD and used for the hole-injection layer 701.

The hole-transport layer 702 is a layer that contains a substance with a high hole-transport property. Examples of the substance with a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or more. Note that other substances may also be used as long as a hole-transport property thereof is higher than an electron-transport property thereof. Further, the layer containing a substance with a high hole-transport property is not limited to a single layer, and may be a stack of two or more layers containing any of the above substances.

As the hole-transport layer 702, a carbazole derivative such as CBP, CzPA, or PCzPA or an anthracene derivative such as t-BuDNA, DNA, or DPAnth may be used.

As the hole-transport layer 702, a high molecular compound such as PVK, PVTPA, PTPDMA, or Poly-TPD can be used.

As the layer 703 containing an organic compound with a light-emitting property, for example, a fluorescent compound, which emits fluorescence, or a phosphorescent compound, which emits phosphorescence, can be used.

The fluorescent compounds that can be used for the layer 703 containing an organic compound with a light-emitting property are given. Examples of the materials that emit blue light include N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N, 9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of the materials that emit red light include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the layer 703 containing an organic compound with a light-emitting property are given. Examples of the materials that emit blue light include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. Examples of the materials that emit green light include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis 2-(4-methoxyphenyl)-3,5-dimethylpyrazinato}iridium(III) (abbreviation: Ir(dmmoppr)$_2$ (acac)), and the like. Examples of the materials that emit orange light include tris(2-phenylquinolinato-N, C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include organometallic complexes such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac), (acetylacetonato)bis[2,3-bis(4-fluorophenyl)quinoxalinato]iridium(III) (abbreviation: Ir(Fdpq)$_2$(acac)), acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphine)platinum(II) (abbreviation: PtOEP). Any of the following rare earth metal complexes can be used for a phosphorescent compound: tris(acetylacetonato) (monophenanthroline)terbium(III) (abbreviation: Tb(acac)$_3$(Phen)); tris(1, 3-diphenyl-1,3-propanedionato) (monophenanthroline) europium(III) (abbreviation: Eu(DBM)$_3$(Phen)); tris[1-(2-thenoyl)-3,3,3-trifluoroacetonato](monophenanthroline) europium(III) (abbreviation: Eu(TTA)$_3$(Phen)), and the like because their light emission (electronic transition between different multiplicities) is from a rare earth metal ion in such a rare earth metal complex.

Note that the layer 703 containing an organic compound with a light-emitting property may have a structure in which the above-described light-emitting organic compound (guest material) is dispersed in another substance (host material). As the host material, various kinds of materials can be used, and it is preferable to use a substance which has a lowest unoccupied molecular orbital level (LUMO level) higher than the light-emitting material and has a highest occupied molecular orbital level (HOMO level) lower than that of the light-emitting material.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III)

(abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to efficiently transfer energy to the guest material.

When a structure in which a guest material is dispersed in a host material is employed, crystallization of the layer 703 containing an organic compound with a light-emitting property can be suppressed. Further, concentration quenching due to high concentration of the guest material can be suppressed.

As the layer 703 containing an organic compound with a light-emitting property, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Further, examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly [(9,9-dioctyl-2,7-divinylenefluorenylene)-alt-co-(2-methoxy-5-(2-ethylhexyloxy)-1,4-phenylene)], and the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of layers containing an organic compound with a light-emitting property and making emission colors of the light-emitting layers different, light emission having a desired color can be obtained from the light-emitting element as a whole. For example, the emission colors of a layer containing a first organic compound with a light-emitting property and a layer containing a second organic compound with a light-emitting property are complementary colors in a light-emitting element having the two layers containing organic compounds with a light-emitting property, whereby the entire light-emitting element can emit white light. Note that the term "complementary" means color relationship in which an achromatic color is obtained when colors are mixed. That is, emission of white light can be obtained by mixture of light emitted from substances whose emission colors are complementary colors. This can be applied to a light-emitting element having three or more layers each containing an organic compound with a light-emitting property.

The electron-transport layer 704 is a layer containing a substance with a high electron-transport property. As the substance with a high electron-transport property, the following metal complexes having a quinoline skeleton or a benzoquinoline skeleton can be given: tris(8-quinolinolato)aluminum (abbreviation: Alq); tris(4-methyl-8-quinolinolato)aluminum (abbreviation: Almq$_3$); bis(10-hydroxybenzo[h]quinolinato)beryllium (abbreviation: BeBq$_2$); and bis(2-methyl-8-quinolinolato)(4-phenylphenolato)aluminum (abbreviation: BAlq). A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can also be used. Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances described here are mainly materials having an electron mobility of $10^{-6}$ cm$^2$/Vs or more. Further, the electron-transport layer is not limited to a single layer, and may be a stack of two or more layers containing any of the above substances.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance with a high electron-injection property can be used for the electron-injection buffer layer 706: for example, an alkali metal, an alkaline earth metal, a rare earth metal, a compound of the above metal (e.g., an alkali metal compound (e.g., oxide such as lithium oxide, halide, or carbonate such as lithium carbonate or cesium carbonate), an alkaline earth metal compound (e.g., oxide, halide, or carbonate), or a rare earth metal compound (e.g., oxide, halide, or carbonate).

Further, in the case where the electron-injection buffer layer 706 contains a substance with a high electron-transport property and a donor substance, the donor substance is preferably added so that the mass ratio of the donor substance to the substance with a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., oxide such as lithium oxide, halide, or carbonate such as lithium carbonate or cesium carbonate), an alkaline earth metal compound (e.g., oxide, halide, and carbonate), or a rare earth metal compound (e.g., oxide, halide, and carbonate). Note that as the substance with a high electron-injection property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 with a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in drive voltage can be prevented.

The electron-relay layer 707 contains a substance with a high electron-transport property and is formed so that the LUMO level of the substance with a high electron-transport property is located between the LUMO level of the acceptor substance in the composite material layer 708 and the LUMO level of the substance with a high electron-transport property contained in the electron-transport layer 704. In the case where the electron-relay layer 707 contains a donor substance, the donor level of the donor substance is controlled so as to be located between the LUMO level of the acceptor material contained in the composite material layer 708 and the LUMO level of the substance with a high electron-transport property contained in the electron-transport layer 704. As a specific value of the energy level, the LUMO level of the substance with a high electron-transport property contained in the electron-relay layer 707 is preferably greater than or equal to −5.0 eV, more preferably greater than or equal to −5.0 eV and less than or equal to −3.0 eV.

As the substance with a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, it is preferable to use any material whose structural formula is as follows: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. A metal-oxygen double bond has an acceptor property (a property of easily accepting electrons); thus, electrons can be transferred (donated and accepted) more easily. Further, a metal complex having a metal-oxygen double bond is stable. Thus, the use of a metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including oxide such as lithium oxide, halide, and carbonate such as lithium carbonate or cesium carbonate), an alkaline earth metal compound (including oxide, halide, and carbonate), and a rare earth metal compound (including oxide, halide, and carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance with a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCB1), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene) (abbreviation: DCMT), methanofullerene such as [6,6]-phenyl C$_{61}$ butyric acid methyl ester, or the like can be used for the electron-relay layer 707.

Note that in the case where a donor substance is contained in the electron-relay layer 707, the electron-relay layer 707 may be formed by a method such as co-evaporation of the substance with a high electron-transport property and the donor substance.

The composite material layer 708 can be formed using the above-described composite material in which an acceptor substance is contained in an organic compound with a high hole-transport property. It is preferable to provide the composite material layer 708 which is in contact with the second light-reflecting conductive film 114, because damage caused to the organic EL layer 112 particularly when the second light-reflecting conductive film 114 is formed by a sputtering method can be reduced. Further, it is not necessary to separately deposit the first light-emitting region 130 and the second light-emitting region 132; thus, the manufacturing time and the manufacturing cost can be reduced.

Figure 7B:
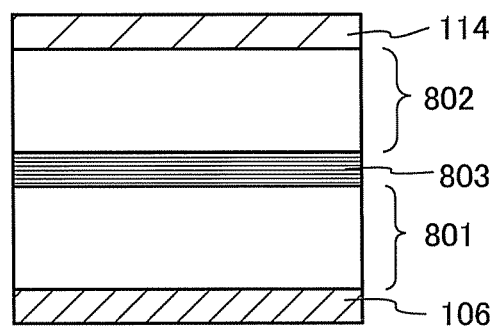

Note that the plurality of organic EL layers may be stacked between the first light-transmitting conductive film 106 and the second light-reflecting conductive film 114 as illustrated in FIG. 7B. In that case, a charge generation layer 803 is preferably provided between a first organic EL layer 801 and a second organic EL layer 802 which are stacked. The charge generation layer 803 can be formed using the above composite material. Further, the charge generation layer 803 may have a stacked structure including a layer containing the composite material and a layer containing another material. In that case, as the layer containing another material, a layer containing an electron donating substance and a substance with a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with any of the above structures of the EL layer.

Further, by making emission colors of the EL layers different, light having a desired color can be obtained from the light-emitting element as a whole. For example, the emission colors of the first and second organic EL layers are complementary in a light-emitting element having the two EL layers, whereby the light-emitting element can be made to emit white light as a whole. Note that "complementary colors" refer to colors that can produce an achromatic color when mixed. That is, when complementary colored light emitted from substances is mixed, white light emission can be obtained. This can be applied to a light-emitting element having three or more EL layers.

Figure 7C:
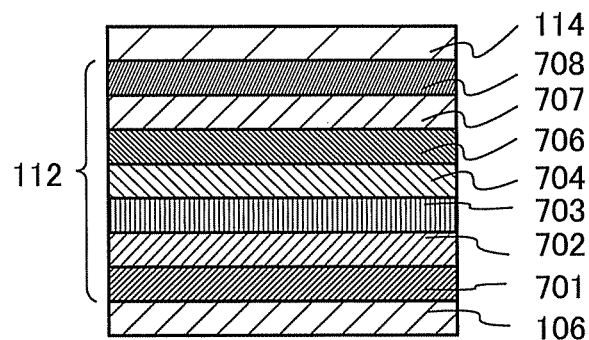

As illustrated in FIG. 7C, the organic EL layer may include, between the first conductive film 106 and the second conductive film 114, the hole-injection layer 701, the hole-transport layer 702, the layer containing an organic compound with a light-emitting property 703, the electron-transport layer 704, and an electron-injection layer 705.

A layer for adjusting an electron-injection property or resistance may be formed in contact with the second light-reflecting conductive film 114 in the first light-emitting region 130 or the second light-transmitting conductive film 116 in the second light-emitting region 132. In particular, in the case where the difference between the emission color or luminance of the first light-emitting region 130 and that of the second light-emitting region 132 can be visually recognized, the adjusting layer is preferably formed.

In the above manner, the organic EL layer 112 in this embodiment can be formed.

Figure 8A:
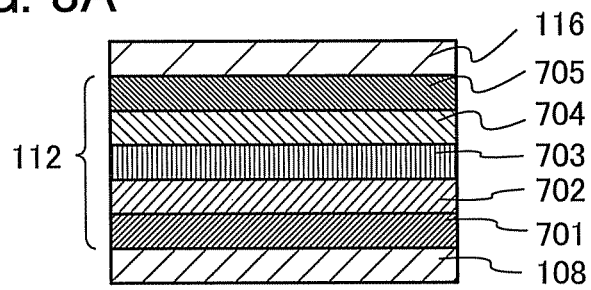
FIGS. 8A to 8C illustrate organic EL layers.
Figure 8B:
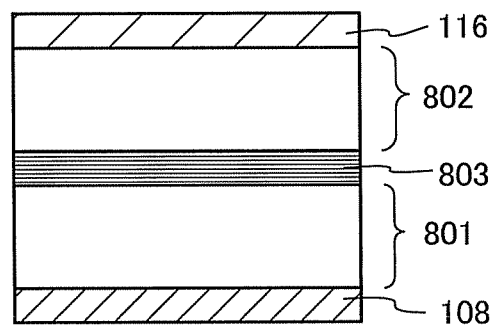
Figure 8C:
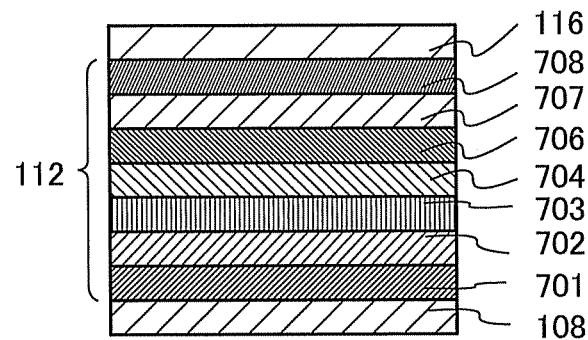

Accordingly, the organic EL layer 112 in the first light-emitting region 130 can be formed. Note that as shown in FIGS. 8A to 8C, the organic EL layer 112 in the second light-emitting region 132 is sandwiched between the first light-reflecting conductive film 108 and the second light-transmitting conductive film 116 instead of the first light-transmitting conductive film 106 and the second light-reflecting conductive film 114, respectively. Other components are similar to those of FIGS. 7A to 7C; thus, detailed description thereof is omitted here.

This embodiment can be combined with any of the other embodiments disclosed in this specification as appropriate.

Embodiment 4

Figure 9:
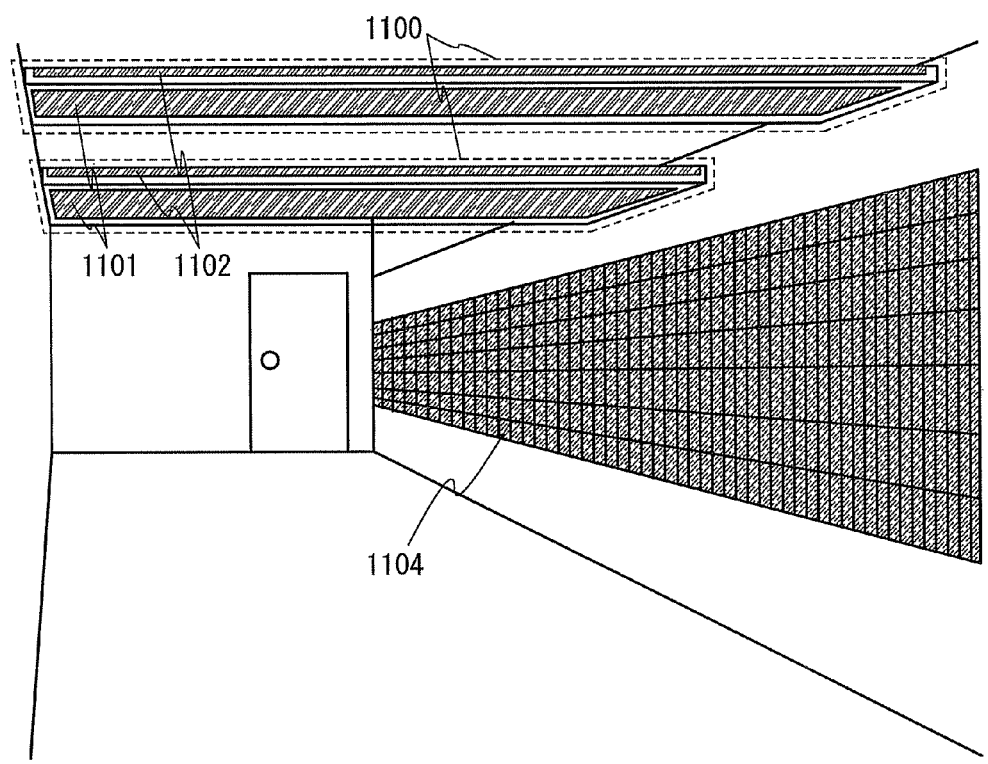
FIG. 9 illustrates embodiments of lighting devices each including light-emitting device according to the present invention.
Figure 10A:
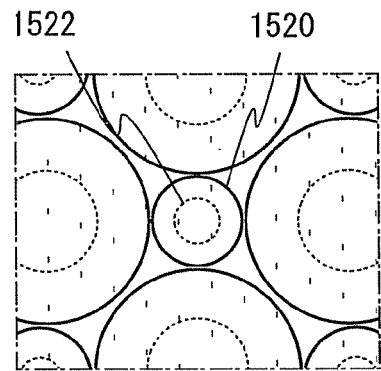
FIGS. 10A to 10C are supplementary views for illustrating a background and a problem.
Figure 10B:
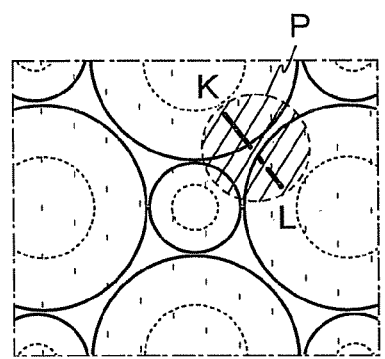
Figure 10C:
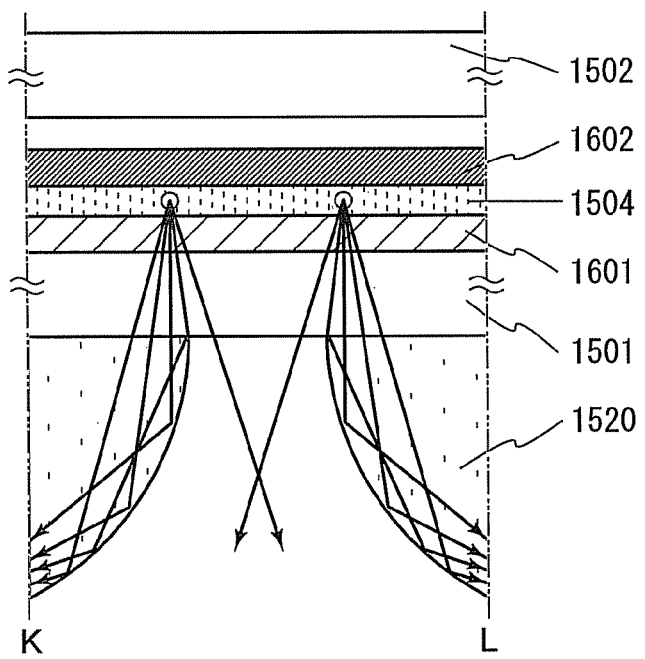
Figure 11A:
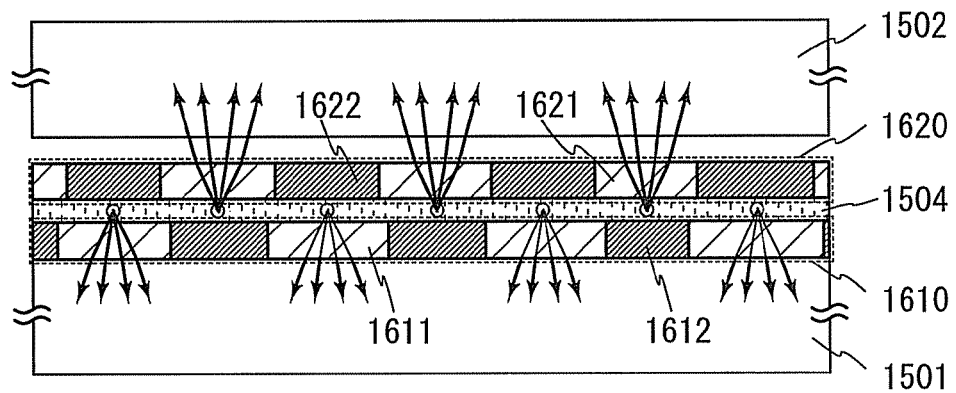
FIGS. 11A and 11B are supplementary views for illustrating a solution.
Figure 11B:
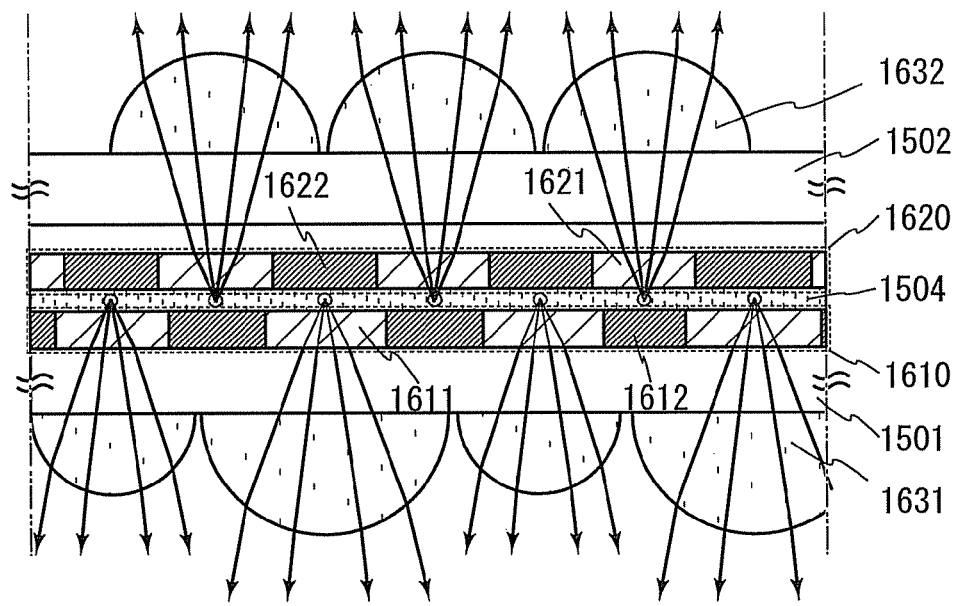

The light-emitting device disclosed in this specification can be applied to a lighting device or an electronic device. FIG. 9 illustrates the case where the light-emitting devices disclosed in this specification are mounted on a ceiling and a wall as an example.

A lighting device 1100 in FIG. 9 is the light-emitting device disclosed in this specification which is used for a ceiling light. Light from a layer (light-emitting layer) containing an organic compound with a light-emitting property in the light-emitting device disclosed in this specification can be extracted efficiently from both surfaces of a substrate. Thus, for example, light extracted from one surface of the substrate can be used for light (direct light) which directly lights up a room through a first light-emitting surface 1101; moreover, light extracted from the other surface of the substrate can be used for indirect light to light up a ceiling by diffusing the light inside the lighting device 1100 in the lateral direction to the substrate and extracting the light from a second light-emitting surface 1102 which is a side surface of the lighting device 1100.

A lighting device 1104 in FIG. 9 is the light-emitting device disclosed in this specification which is used for a wall light. Although only one room is lit in FIG. 9, an adjacent room can also be lit at the same time in the case where a wall in which the lighting device 1104 is embedded has a light-transmitting property, because light from a layer (light-emitting layer) containing an organic compound with a light-emitting property in the light-emitting device disclosed in this specification can be extracted efficiently from both surfaces of a substrate.

Note that in the case where a plurality of light-emitting devices is mounted on a wall surface as the display device 1104, part of them is used to emit light of a different color (for example, a color of light emitted from part of the light-emitting devices is different from a color of light emitted from the others so that a character can be displayed). A plurality of units, each of which includes light-emitting devices which emit red light, blue light, and green light that are arranged to be adjacent to each other, is arranged to be adjacent to each other, so that it can be used for a display device such as digital signage.

When the light-emitting device disclosed in this specification is used for the lighting device 1100 or the lighting device 1104, a highly designed light-emitting device with low power consumption can be provided. Further, the light-emitting device disclosed in this specification can be used for a display device as described above. Note that in the case where the light-emitting device is used for a display device, a light-emitting device which emits light of different colors can be manufactured by applying the description in this embodiment. Therefore, the takt time and cost for manufacturing the light-emitting device can be reduced, and thus various light-emitting devices can be manufactured at low cost.

This application is based on Japanese Patent Application serial No. 2011-029185 filed with Japan Patent Office on Feb. 14, 2011, the entire contents of which are hereby incorporated by reference.

What is claimed is:

1. A light-emitting device comprising:
a first substrate comprising a first optical structure body at a bottom side of the first substrate;
a first electrode over the first substrate comprising:
  a first light-transmitting conductive film; and
  a first light-reflecting conductive film;
a second electrode over the first electrode comprising:
  a second light-transmitting conductive film; and
  a second light-reflecting conductive film;
a light-emitting layer sandwiched between the first electrode and the second electrode, the light-emitting layer comprising:
  a first light-emitting region in contact with and sandwiched between the first light-transmitting conductive film and the second light-reflecting conductive film; and
  a second light-emitting region in contact with and sandwiched between the first light-reflecting conductive film and the second light-transmitting conductive film; and
a second substrate over the second electrode, the second substrate comprising a second optical structure body at a top side of the second substrate,
wherein the first optical structure body overlaps with the first light-emitting region, and
wherein the second optical structure body overlaps with the second light-emitting region.

2. The light-emitting device according to claim 1,
wherein a periphery of the first light-emitting region is on the inner side than a periphery of the first optical structure body, and
wherein a periphery of the second light-emitting region is on the inner side than a periphery of the second optical structure body.

3. The light-emitting device according to claim 1, wherein the first light-emitting region and the second light-emitting region do not overlap with each other.

4. The light-emitting device according to claim 1,
wherein the first light-transmitting conductive film and the second light-transmitting conductive film each transmit 70% or more of light with a wavelength of longer than or equal to 400 nm and shorter than or equal to 700 nm, and
wherein the first light-reflecting conductive film and the second light-reflecting conductive film each reflect 50% or more of light with a wavelength of longer than or equal to 400 nm and shorter than or equal to 700 nm.

5. The light-emitting device according to claim 1,
wherein a diameter of the first optical structure body is set greater than or equal to 1.1 times and smaller than or equal to 3 times a diameter of the first light-emitting region, and
wherein a diameter of the second optical structure body is set greater than or equal to 1.1 times and smaller than or equal to 3 times a diameter of the second light-emitting region.

6. The light-emitting device according to claim 1, wherein the light-emitting layer comprises a layer comprising an organic compound with a light-emitting property.

7. The light-emitting device according to claim 1,
wherein the first optical structure body comprises a film at the bottom side of the first substrate, and
wherein the second optical structure body comprises a film at the top side of the second substrate.

8. The light-emitting device according to claim 1,
wherein the first substrate includes a curved bottom surface as the first optical structure body, and
wherein the second substrate includes a curved top surface as the second optical structure body.

9. The light-emitting device according to claim 1, wherein at least one of the first light-reflecting conductive film and the second light-reflecting conductive film has an island shape.

10. The light-emitting device according to claim 1, wherein at least one of the first light-reflecting conductive film and the second light-reflecting conductive film is arranged in stripe form.

11. A light-emitting device comprising:
a first substrate comprising a plurality of first optical structure bodies at a bottom side of the first substrate;
a first electrode over the first substrate comprising:
  a first light-transmitting conductive film; and
  a first light-reflecting conductive film;
a second electrode over the first electrode comprising:
  a second light-transmitting conductive film; and
  a second light-reflecting conductive film;
a light-emitting layer sandwiched between the first electrode and the second electrode, the light-emitting layer comprising:
  a plurality of first light-emitting regions in contact with and sandwiched between the first light-transmitting conductive film and the second light-reflecting conductive film; and
  a plurality of second light-emitting regions in contact with and sandwiched between the first light-reflecting conductive film and the second light-transmitting conductive film; and
a second substrate over the second electrode, the second substrate comprising a plurality of second optical structure bodies at a top side of the second substrate,
wherein each of the plurality of first light-emitting regions overlaps with a corresponding one of the plurality of first optical structure bodies, and
wherein each of the plurality of second light-emitting regions overlaps with a corresponding one of the plurality of second optical structure bodies.

12. The light-emitting device according to claim 11,
wherein each periphery of the plurality of first light-emitting regions is on the inner side than a periphery of a corresponding one of the plurality of first optical structure bodies, and
wherein each periphery of the plurality of second light-emitting regions is on the inner side than a periphery of a corresponding one of the plurality of second optical structure bodies.

13. The light-emitting device according to claim 11, wherein the plurality of first light-emitting regions and the plurality of second light-emitting regions do not overlap with each other.

14. The light-emitting device according to claim 11,
wherein the first light-transmitting conductive film and the second light-transmitting conductive film each transmit 70% or more of light with a wavelength of longer than or equal to 400 nm and shorter than or equal to 700 nm, and
wherein the first light-reflecting conductive film and the second light-reflecting conductive film each reflect 50% or more of light with a wavelength of longer than or equal to 400 nm and shorter than or equal to 700 nm.

15. The light-emitting device according to claim 11,
wherein each diameter of the plurality of first optical structure bodies is set greater than or equal to 1.1 times and smaller than or equal to 3 times a diameter of a corresponding one of the plurality of first light-emitting regions, and
wherein each diameter of the plurality of second optical structure bodies is set greater than or equal to 1.1 times and smaller than or equal to 3 times a diameter of a corresponding one of the plurality of second light-emitting regions.

16. The light-emitting device according to claim 11, wherein the light-emitting layer comprises a layer comprising an organic compound with a light-emitting property.

17. The light-emitting device according to claim 11,
wherein the plurality of first optical structure bodies comprise films at the bottom side of the first substrate, and
wherein at least one of the plurality of second optical structure bodies comprise films at the top side of the second substrate.

18. The light-emitting device according to claim 11,
wherein the first substrate includes a curved bottom surface as the plurality of first optical structure bodies, and
wherein the second substrate includes a curved top surface as the plurality of second optical structure bodies.

19. The light-emitting device according to claim 11, wherein at least one of the first light-reflecting conductive film and the second light-reflecting conductive film is arranged in stripe form.

* * * * *

UNITED STATES PATENT AND TRADEMARK OFFICE
CERTIFICATE OF CORRECTION

PATENT NO. : 8,569,783 B2
APPLICATION NO. : 13/371412
DATED : October 29, 2013
INVENTOR(S) : Aoyama et al.

It is certified that error appears in the above-identified patent and that said Letters Patent is hereby corrected as shown below:

In the Specification:

Col. 2, Line 11; Change "which is, opposite" to --which is opposite--.
Col. 4, Line 15; Change "700 nm; so" to --700 nm, so--.
Col. 4, Line 40; Change "Interface" to --interface--.
Col. 5, Line 19; Change "including light emitting device" to --including a light-emitting device--.
Col. 8, Line 30; Change "faulted" to --formed--.
Col. 10, Line 37; Change "framed" to --formed--.
Col. 18, Line 37; Change "organic, compound" to --organic compound--.
Col. 19, Lines 36 to 37; Change "]-N,N-diphenylstilbene" to --"]-N,N'-diphenylstilbene--.
Col. 24, Line 43; Change "PTCB1)," to --PTCBI),--.

Signed and Sealed this
First Day of April, 2014

Michelle K. Lee
*Deputy Director of the United States Patent and Trademark Office*